(12) United States Patent
Yamazaki et al.

(10) Patent No.: US 7,768,007 B2
(45) Date of Patent: Aug. 3, 2010

(54) INFORMATION DEVICE

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1903 days.

(21) Appl. No.: 10/802,787

(22) Filed: Mar. 18, 2004

(65) Prior Publication Data

US 2004/0174324 A1   Sep. 9, 2004

Related U.S. Application Data

(62) Division of application No. 10/012,370, filed on Dec. 12, 2001, now Pat. No. 6,747,290.

(30) Foreign Application Priority Data

Dec. 12, 2000 (JP) .............................. 2000-376760

(51) Int. Cl.
*H01L 29/04* (2006.01)
(52) U.S. Cl. .......................... 257/59; 257/21; 257/40; 257/53; 345/76
(58) Field of Classification Search ................... 257/21, 257/40, 53; 345/76
See application file for complete search history.

(56) References Cited

U.S. PATENT DOCUMENTS

| 4,806,748 A | 2/1989 | Takami et al. |
| 4,839,634 A | 6/1989 | More et al. |
| 5,386,543 A * | 1/1995 | Bird ........................ 358/1.1 |
| 5,446,564 A | 8/1995 | Mawatari et al. |
| 5,627,364 A | 5/1997 | Codama et al. |
| 5,640,067 A * | 6/1997 | Yamauchi et al. ........... 313/504 |
| 5,663,745 A * | 9/1997 | Ishikawa et al. .............. 345/98 |
| 5,666,438 A | 9/1997 | Beernink et al. |
| 5,920,401 A | 7/1999 | Street et al. |
| 6,028,581 A * | 2/2000 | Umeya ....................... 345/104 |
| 6,040,810 A | 3/2000 | Nishimura |
| 6,087,648 A | 7/2000 | Zhang et al. |
| 6,160,272 A | 12/2000 | Arai et al. |
| 6,188,380 B1 | 2/2001 | Kawashima et al. |
| 6,236,063 B1 | 5/2001 | Yamazaki et al. |
| 6,243,155 B1 | 6/2001 | Zhang et al. |
| 6,287,888 B1 | 9/2001 | Sakakura et al. |

(Continued)

FOREIGN PATENT DOCUMENTS

JP   61-082585   4/1986

(Continued)

*Primary Examiner*—Thinh T Nguyen
(74) *Attorney, Agent, or Firm*—Fish & Richardson P.C.

(57) ABSTRACT

Problems exist in areas such as image visibility, endurance of the device, precision, miniaturization, and electric power consumption in an information device having a conventional resistive film method or optical method pen input function. Both EL elements and photoelectric conversion elements are arranged in each pixel of a display device in an information device of the present invention having a pen input function. Information input is performed by the input of light to the photoelectric conversion elements in accordance with a pen that reflects light by a pen tip. An information device with a pen input function, capable of displaying a clear image without loss of brightness in the displayed image, having superior endurance, capable of being miniaturized, and having good precision can thus be obtained.

40 Claims, 21 Drawing Sheets

U.S. PATENT DOCUMENTS

| | | |
|---|---|---|
| 6,320,325 B1 * | 11/2001 | Cok et al. ................ 315/169.3 |
| 6,380,673 B1 | 4/2002 | Sekiya et al. |
| 6,404,137 B1 | 6/2002 | Shodo |
| 6,472,804 B2 * | 10/2002 | Mueller et al. .............. 313/326 |
| 6,476,864 B1 | 11/2002 | Borg et al. |
| 6,480,305 B1 | 11/2002 | Resman |
| 6,600,160 B2 | 7/2003 | Kobayashi et al. |
| 6,787,778 B2 | 9/2004 | Kobayashi et al. |
| 7,005,647 B2 | 2/2006 | Kobayashi et al. |
| 7,030,551 B2 * | 4/2006 | Yamazaki et al. ........... 313/498 |
| 2001/0031074 A1 | 10/2001 | Yamazaki et al. |
| 2002/0011972 A1 | 1/2002 | Yamazaki et al. |
| 2002/0044208 A1 | 4/2002 | Yamazaki et al. |
| 2005/0206764 A1 | 9/2005 | Kobayashi et al. |

FOREIGN PATENT DOCUMENTS

| | | |
|---|---|---|
| JP | 61-177530 | 8/1986 |
| JP | 09-114584 | 5/1997 |
| JP | 10-240906 | 9/1998 |
| JP | 11-121731 | 4/1999 |
| JP | 11-307756 | 11/1999 |
| JP | 2000-208724 | 7/2000 |
| JP | 2000-259349 | 9/2000 |

* cited by examiner

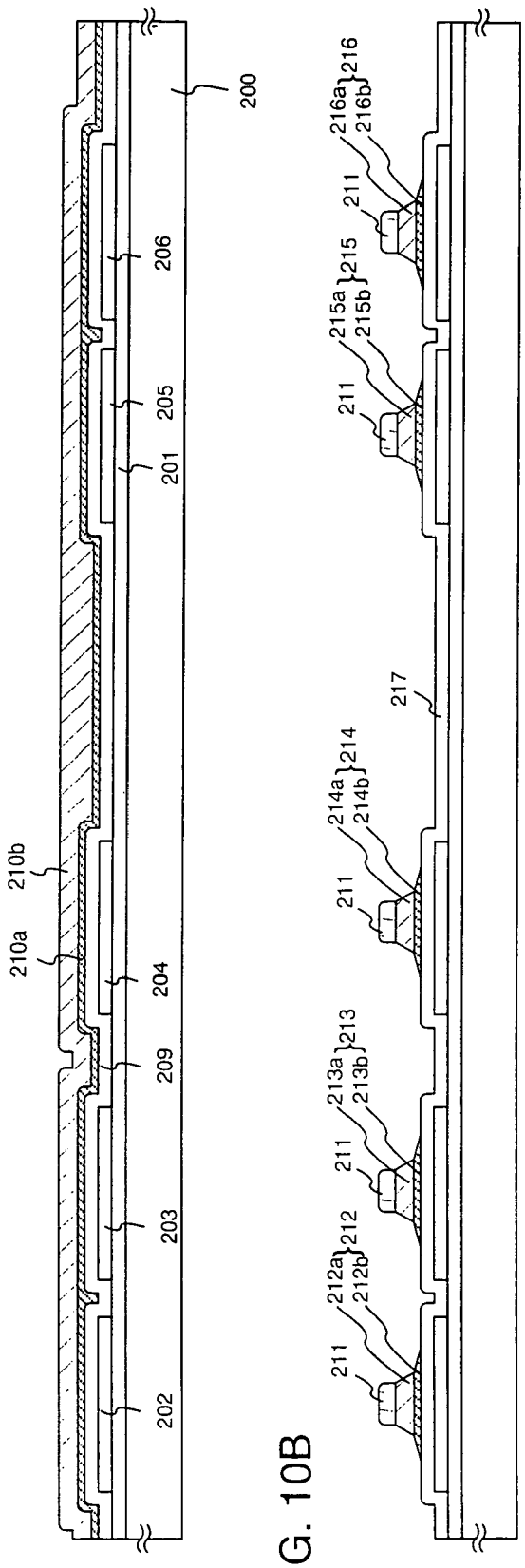

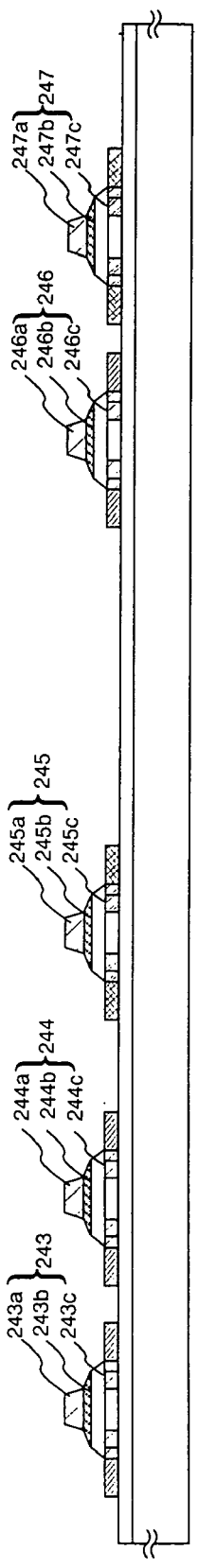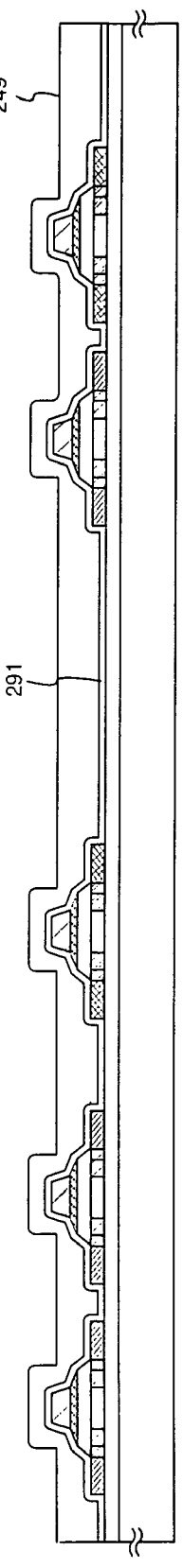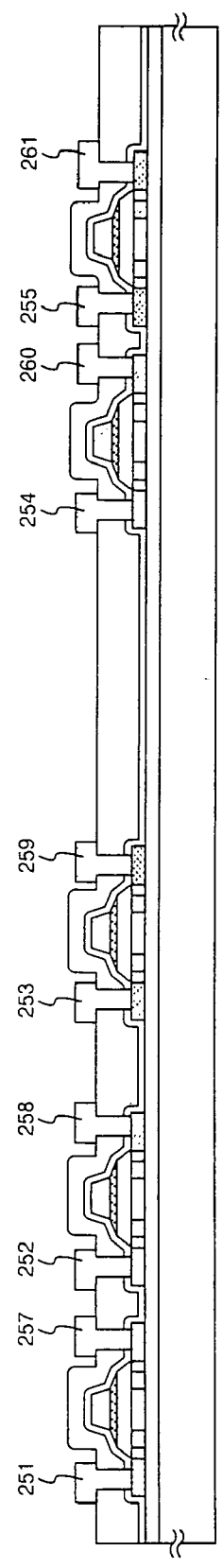

INFORMATION DEVICE

CROSS-REFERENCE TO RELATED APPLICATION

This application is a divisional application of U.S. application Ser. No. 10/012,370, filed on Dec. 12, 2001 now U.S. Pat. No. 6,747,290, which claims the benefit of a foreign priority application filed in Japan on Dec. 12, 2000 as Serial No. 2000-376760. This application claims priority to each of these prior applications, and the disclosures of the prior applications are considered part of (and are incorporated by reference in) the disclosure of this application.

BACKGROUND OF THE INVENTION

1. Field of the Invention

The present invention relates to an information device having a function for inputting information by using means such as a pen. In particular, the present invention relates to an information device in which pen input operations are performed on a screen of a display device. The present invention relates to an EL display device using EL elements as the display device, and further, relates to electronic devices, such as portable information devices, having the information device of the present invention.

Note that, in this specification, the term EL element denotes an EL element utilizing both light emission from singlet excitons (fluorescence) and light emission from triplet excitons (phosphorescence).

2. Description of the Related Art

The demand for pen input method portable information devices has risen in terms of miniaturization and operability. The pen input method is a method for the input of information by using a specialized pen or arbitrary pen, and by either contacting pen tip to a display screen, or bringing the pen tip close to the display screen.

Namely, input of information corresponding to positions indicated by the pen tip on the display screen is performed. The display screen also functions as a pen input screen. It is necessary to specify the positions indicated by the pen on the pen input screen with this pen input method, and methods such as a resistive film method and an optical method exist as means for the pen input.

The resistive film method is explained first.

FIG. 7 is a cross sectional diagram showing the structure of a resistive film pen input device. Note that a pen input device 7711 is formed overlapping with and on the upper portion of a display device 7708. The display device 7708 has a display portion 7709 and a peripheral circuit 7710.

A movable electrode 7701 and a fixed electrode 7702 sandwich dot spacers 7704 in the pen input device 7711, and both are connected in parallel with a gap of approximately 100 to 300 μm by a lamination material 7703. The movable electrode 7701 and the fixed electrode 7702 are formed by conductive materials having transparency so that images projected on the display portion 7709 of the display device 7708 can be seen through the pen input device 7711. In general, an indium tin oxide (ITO) film is used as the conductive material having transparent properties.

The movable electrode 7701 touches the fixed electrode 7702 in a position indicated by the input pen 7704 on the pen input device 7711 with the resistive film method (input point A in FIG. 7). At this time, in the method, the position of the input point A is read out as the ratio of resistances R1 and R2 from two position detection electrodes 7706 and 7707.

Specifically, an example of performing position read out is shown in FIG. 8. A pressure is applied by an input pen 807 from a movable electrode 801 side and there is contact between the movable electrode 801 and a fixed electrode 802 at the input point A. A voltage is applied between two electrodes 803 and 804 of the movable electrode 801 here, and an electric potential gradient is generated within the movable electrode 801. By measuring the electric potential $V_A$ of the input point A at this point, resistance values $R_{x1}$ and $R_{x2}$ from the electrode 803 and the electrode 804 to the input point A can be found. If the film quality of the movable electrode 801 is assumed to be uniform, then the resistance values $R_{x1}$ and $R_{x2}$ are proportional to the distances from the electrodes 803 and 804 to the input point A, respectively.

Similarly, a voltage is applied between two electrodes 805 and 806 of the fixed electrode 802, and an electric potential gradient within the fixed electrode 802 is generated. By knowing the electric potential $V_A$ of the input point A at this point, resistance values $R_{y1}$ and $R_{y2}$ from the electrode 805 and the electrode 806 to the input point A can be found. If the film quality of the fixed electrode 802 is assumed to be uniform here, then the resistance values $R_{y1}$ and $R_{y2}$ are proportional to the distances from the electrodes 805 and 806 to the point A, respectively. The position of the input point A can thus be determined.

Note that the method of measuring the electric potential of the input point A for measuring the position of the input point A is not limited to the above structure, and various other methods can also be used.

An optical method pen input device is explained next. A schematic diagram of an upper surface of the optical method pen input device is shown in FIG. 9A.

If a pen tip of an input pen 901 makes contact to an input portion 902, the contact position is detected. The position detection operation is explained.

X-1 light emitting diodes (hereafter referred to as LEDs) $2_1$ to $2_x$ are arranged in a right edge portion in the periphery of the input portion 902, and x-1 phototransistors (hereafter referred to as PTs) $3_1$ to $3_x$ are arranged in a left edge portion of the input portion 902, opposite the LEDs $2_1$ to $2_x$. The light emitting diodes and the phototransistors are embedded in a frame 4.

Y-1 LEDs $5_1$ to $5_y$ are arranged in a lower edge portion, and y-1 PTs $6_1$ to $6_y$ are arranged in an upper edge portion, opposite the LEDs $5_1$ to $5_y$. The LEDs and the PTs are embedded in the frame 4.

The LEDs $2_1$ to $2_x$ and the PTs $3_1$ to $3_x$ form x-1 horizontal direction touch input lines, and the LEDs $5_1$ to $5_y$ and the PTs $6_1$ to $6_y$ form y-1 vertical direction touch input lines.

The term touch input lines refer to paths along which light emitted from the LEDs travels when input to the PTs between pairs of opposing LEDs and PTs.

Note that although PTs are used as the components having reference numerals $3_1$ to $3_x$ and $6_1$ to $6_y$, there is no limitation associated with PTs, and other components can be freely used provided that they are photoelectric conversion elements that convert light into an electric signal.

In order to increase the directionality of light emitted from the LEDs $2_1$ to $2_x$ and $5_1$ to $5_x$, and made incident on the PTs $3_1$ to $3_x$ and $6_1$ to $6_y$, hole shaped slits 7 are formed in front of the frame 4 in which each of the elements is embedded.

FIG. 9B is a cross sectional diagram along a line segment a-a' of FIG. 9A. A display device 910 is formed in a portion below the pen input device. The display device 910 is structured by a display portion 911 and a peripheral circuit 912.

Differing from the resistive film method, it is possible to directly see images displayed in the display portion 911.

FIG. 9A is again referenced.

The emission of light and the receiving of light are performed one pair at a time from the edge for the pairs of opposing LEDs and PTs. This operation (hereafter referred to as scanning) is performed at the same time for the horizontal direction touch input lines and the vertical direction touch input lines in the pen input device having the above structure.

One point within the input portion 902 is indicated by the input pen 901. The input point A within FIG. 9A is indicated. Light is cutoff between two touch lines $2_n$ to $3_n$ and $5_m$ to $6_m$ at this point, and the position A at which the input pen 901 contacts is recognized.

It is necessary to mechanically change the shape of the movable electrode as information is input with the resistive film method. The movable electrode thus fatigues with repeated shape change, and there is the possibility of it being broken. This becomes an endurance problem.

Further, even if damage does not reach actual breakage, the ITO film conductivity becomes non-uniform due to repeated deformation and in the case where minute cracks on the order of micrometers in size are formed during manufacturing process. Therefore, problems in the precision of input pen location detection develop.

In addition, the display device image is read out through the two electrodes, the movable electrode and the fixed electrode. The transmittivity of the transparent electrodes is not 100% at this time, and therefore light from the display device is attenuated and brightness of the image falls, generating visibility problems with the screen. The intensity of light emitted form the display device consequently must be made stronger so as to increase the brightness of the image, and there is a problem with increased power consumption of the device.

Further, when stress opposing substrate is applied from the outside of the device, and the distance between the two electrodes, the movable electrode and the fixed electrode, becomes equal to or less than 40 μm, then a problem exists in which Newton rings appear due to an interference effect of light reflected between the two electrodes.

In addition, this is a capacitor structure in which the two electrodes are arranged in parallel, and therefore consumption is large when a battery electric power source is used. This is a large problem for portable information devices in which low power consumption is desired.

On the other hand, there are no mechanical endurance problems with the optical method pen input device because it is not necessary for the thin films to repeatedly be deformed as with the resistive film method. Further, the display device is not seen through transparent electrodes, and therefore problems with screen visibility are also few.

However, for cases where light emitted from the light emitting elements is not received in a straight line by the paired light receiving elements, there is a possibility that recognition will not be made even if the input pen or the like indicates the position.

Furthermore, it is necessary to form columns of light emitting elements and light receiving elements, slits and the like on the display device, and therefore there is a problem in that it is difficult to make the device smaller.

SUMMARY OF THE INVENTION

With an information device having a pen input function according to the present invention, both EL (electroluminescence) elements and photoelectric conversion elements are arranged in pixels of a display device, and input of information is performed by a pen reflecting light in a tip of the pen.

EL elements are self light emitting elements, and are mainly used in EL display devices. EL display devices are also referred to as organic EL display devices (organic EL displays, OELDs) and organic light emitting diodes (OLEDs).

The EL element is structured by sandwiching an EL layer between a pair of electrodes (an anode and a cathode). The EL layer normally has a lamination structure. A lamination structure proposed by Tang, et al. of Eastman Kodak Corp. having a hole transporting layer, a light emitting layer, and an electron transporting layer can be typically given. This structure is known to emit light with extremely high efficiency.

Further, other lamination structures may also be formed on the electrode, such as a lamination of a hole injecting layer, a hole transporting layer, a light emitting layer, and an electron transporting layer, and a lamination structure of a hole injecting layer, a hole transporting layer, a light emitting layer, an electron transporting layer, and an electron injecting layer. A material such as a fluorescent pigment may also be doped into the light emitting layer.

The term EL layer indicates all of the layers formed between a pair of electrodes in this specification. The layers such as the hole injecting layer, the hole transporting layer, the light emitting layer, the electron transporting layer, and the electron injecting layer stated above are therefore all contained within the category of EL layers. A predetermined voltage is applied to the above structured EL layers from the pair of electrodes. Recombination of the carrier thus occurs in the light emitting layer, and light is emitted.

Note that the EL layer is not limited to one having a lamination structure in which the layers are clearly separated, such as the hole injecting layer, the hole transporting layer, the light emitting layer, the electron transporting layer, and the electron injecting layer. Namely, the EL layer may also take a structure having, a layer in which materials structuring the layers such as the hole injecting layer, the hole transporting layer, the light emitting layer, the electron transporting layer, and the electron injecting layer are mixed.

For example, an EL layer with a structure having a mixed layer between an electron transporting layer and a light emitting layer, the mixed layer structured by a material structuring an electron transporting layer (hereafter referred to as an electron transporting material) and a material structuring a light emitting layer (hereafter referred to as a light emitting material), may also be used.

Note that low molecular weight materials, high molecular weight materials, and intermediate molecular weight materials may all be used for the EL layer.

Note also that, within this specification, the term intermediate molecular weight material indicates a material which does not have sublimation properties and in which the length of molecules linked together is 10 μm or less.

Photodiodes and the like can be used as the photoelectric conversion elements. The term photodiode denotes an element having an anode electrode, a cathode electrode, and a photoelectric conversion layer between the anode electrode and the cathode electrode in this specification.

Note that photodiodes are not limited to this structure, and PIN structure photodiodes having a photoelectric conversion layer constituted of a p-type semiconductor layer, an n-type semiconductor layer and an i-type (intrinsic) semiconductor layer between the p-type semiconductor layer and the n-type semiconductor layer may also be used. Further, a PN type photodiode constituted of a p-type semiconductor layer and an n-type semiconductor layer may also be used.

Furthermore, an element having a photoelectric conversion layer made from an organic compound or the like may also be used as the photoelectric conversion element.

If light is irradiated after applying an inverse bias voltage between the cathode electrode and the anode electrode of a photodiode (hereafter referred to as between the photodiode electrodes), then the voltage between the electrodes is lowered by a carrier developing due to the light. The amount that the voltage drops becomes larger as the intensity of the irradiated light becomes stronger. Light is thus detected as an electric signal by the ratio of the voltage in the case where light is irradiated to the photodiode and the voltage in the case where there is no irradiation of light.

EL elements and photodiodes are formed in a matrix shape on the same substrate, and the operation of each of the EL elements and the photodiodes is controlled by using thin film transistors (TFTs) similarly formed in a matrix shape.

An information device that displays a clear image without losing image brightness and that is excellent in durability, enabling miniaturization, having good precision, and having a low electric power consumption pen input function can thus be obtained.

Structures of the information device of the present invention are stated below.

In accordance with the present invention, there is provided an information device having:
a plurality of pixels; an input pen; and an EL element and a photoelectric conversion element in each of the plurality of pixels;
characterized in that:
light emitted from the EL elements is reflected by the input pen; and the light reflected by the input pen performs information input by being input to the photoelectric conversion elements.

The information device may also be characterized in that the EL elements and the photoelectric conversion elements are formed on the same substrate.

The information device may also be characterized in that the photoelectric conversion elements are photodiodes.

In accordance with the present invention, there is provided an information device having:
a plurality of pixels;
an EL display source signal line driver circuit;
an EL display gate signal line driver circuit;
a plurality of EL display source signal lines;
a plurality of EL display gate signal lines;
a plurality of electric power source supply lines; and
an input pen;
characterized in that:
the EL display source signal line driver circuit inputs signals to the plurality of EL display source signal lines;
the EL display gate signal line driver circuit inputs signals to the plurality of EL display gate signal lines;
the plurality of pixels each have an EL display portion and a sensor portion;
the EL display portion and the sensor portion are formed on the same substrate;
the EL display portion has a switching TFT, an EL driver TFT, and an EL element;
a gate electrode of the switching TFT is connected to one of the plurality of EL display gate signal lines;
one of a source region and a drain region of the switching TFT is connected to one of the plurality of EL display source signal lines, and the other of the source region and the drain region of the switching TFT is connected to a gate electrode of the EL driver TFT;
one of a source region and a drain region of the EL driver TFT is connected to one of the plurality of electric power source supply lines, and the other of the source region and the drain region of the EL driver TFT is connected to the EL element;
the sensor portion has a photodiode;
light emitted by the EL element is reflected by the input pen; and
input of information is performed in accordance with the light reflected by the input pen being input to the photodiode.

In accordance with the present invention, there is provided an information device having:
a plurality of pixels;
a sensor source signal line driver circuit;
a sensor gate signal line driver circuit;
a plurality of sensor output wirings;
a plurality of sensor gate signal lines;
a plurality of reset gate signal lines;
a plurality of sensor electric power source lines; and
an input pen;
characterized in that:
the sensor source signal line driver circuit reads in signals from the plurality of sensor output wirings;
the sensor gate signal line driver circuit outputs signals to the plurality of sensor gate signal lines and to the plurality of reset gate signal lines;
the plurality of pixels each have an EL display portion and a sensor portion;
the EL display portion and the sensor portion are formed on the same substrate;
the sensor portion has a selection TFT, a buffer TFT, a reset TFT, and a photodiode;
a gate electrode of the selection TFT is connected to one of the plurality of sensor gate signal lines;
one of a source region and a drain region of the selection TFT is connected to one of the plurality of sensor output wirings, and the other of the source region and the drain region of the selection TFT is connected to one of a source region and a drain region of the buffer TFT;
one of the source region and the drain region of the buffer TFT, which is not connected to the selection TFT, is connected to one of the plurality of sensor electric power source lines;
a gate electrode of the buffer TFT is connected to the photodiode and to a source region or a drain region of the reset TFT;
one of the source region and the drain region of the reset TFT which is not connected to the buffer TFT, is connected to one of the plurality of sensor electric power source lines;
a gate electrode of the reset TFT is connected to one of the plurality of the reset gate signal lines;
the EL display portion has an EL element;
light emitted by the EL element is reflected by the input pen; and
input of information is performed in accordance with the light reflected by the input pen being input to the photodiode.

In accordance with the present invention, there is provided an information device having:
a plurality of pixels;
an EL display source signal line driver circuit;
an EL display gate signal line driver circuit;
a sensor source signal line driver circuit;
a sensor gate signal line driver circuit;
a plurality of EL display source signal lines;

a plurality of EL display gate signal lines;
a plurality of electric power source supply lines;
a plurality of sensor output wirings;
a plurality of sensor gate signal lines;
a plurality of reset gate signal lines,
a plurality of sensor electric power source lines; and
an input pen;
characterized in that:
the EL display source signal line driver circuit outputs signals to the plurality of EL display source signal lines;
the EL display gate signal line driver circuit outputs signals to the plurality of EL display gate signal lines;
the sensor source signal line driver circuit reads in signals from the plurality of sensor output wirings;
the sensor gate signal line driver circuit outputs signals to the plurality of sensor gate signal lines and to the plurality of reset gate signal lines;
the plurality of pixels each have an EL display portion and a sensor portion;
the EL display portion and the sensor portion are formed on the same substrate;
the EL display portion has a switching TFT, an EL driver TFT, and an EL element;
a gate electrode of the switching TFT is connected to one of the plurality of EL display gate signal lines;
one of a source region and a drain region of the switching TFT is connected to one of the plurality of EL display source signal lines, and the other of the source region and the drain region of the switching TFT is connected to a gate electrode of the EL driver TFT;
one of a source region and a drain region of the EL driver TFT is connected to one of the plurality of electric power source supply lines, and the other of the source region and the drain region of the EL driver TFT is connected to the EL element;
the sensor portion has a selection TFT, a buffer TFT, a reset TFT, and a photodiode;
a gate electrode of the selection TFT is connected to one of the plurality of sensor gate signal lines;
one of a source region and a drain region of the selection TFT is connected to one of the plurality of sensor output wirings, and the other of the source region and the drain region of the selection TFT is connected to one of a source region and a drain region of the buffer TFT;
one of the source region and the drain region of the buffer TFT, which is not connected to the selection TFT, is connected to one of the plurality of sensor electric-power source lines;
a gate electrode of the buffer TFT is connected to the photodiode and to a source region or a drain region of the reset TFT;
one of the source region and the drain region of the reset TFT, which is not connected to the buffer TFT, is connected to one of the plurality of sensor electric power source lines;
a gate electrode of the reset TFT is connected to one of the plurality of the reset gate signal lines;
light emitted by the EL element is reflected by the input pen; and
input of information is performed in accordance with the light reflected by the input pen being input to the photodiode.

The information device may also be one in which the EL display source signal line driver circuit and the EL display gate signal line driver circuit are formed on the same substrate as the EL display portion and the sensor portion.

The information device may also be one in which the sensor source signal line driver circuit and the sensor gate signal line driver circuit are formed on the same substrate as the EL display portion and the sensor portion.

The information device may also be characterized in that the EL display source signal line driver circuit, the EL display gate signal line driver circuit, the sensor source signal line driver circuit and the sensor gate signal line driver circuit are formed on the same substrate as the EL display portion and the sensor portion.

The information device may also be characterized in that the photodiode has an anode electrode, a cathode electrode, and a photoelectric conversion layer sandwiched between the anode electrode and the cathode electrode.

The information device may also be characterized in that the photoelectric conversion layer is structured by an organic material.

The information device may also be characterized in that the photodiode has a p-type semiconductor layer, an n-type semiconductor layer, and a photoelectric conversion layer sandwiched between the p-type semiconductor layer and the n-type semiconductor layer.

The information device may also be characterized in that the photoelectric conversion layer is structured by an amorphous semiconductor.

The information device may also be characterized in that:
light emitted from the EL elements is irradiated to a surface of an object;
the light irradiated to the surface of the object is reflected by the surface of the object; and
information regarding the surface of the object is input as an image in accordance with the light reflected by the surface of the object being input to the photoelectric conversion elements.

The information device may also be characterized in that information regarding the surface of the object is biological information.

The information device may also be characterized in that the biological information is a palm print.

The information device may also be characterized in that the biological information is a finger print.

The information device may also be a portable information terminal or a PDA.

BRIEF DESCRIPTION OF THE DRAWINGS

In the accompanying drawings:

FIGS. 10A to 10C are diagrams showing a method of manufacturing an information device of the present invention;

FIGS. 12A to 12C are diagrams showing the method of manufacturing an information device of the present invention;

DETAILED DESCRIPTION OF THE PREFERRED EMBODIMENTS

An embodiment mode of the present invention is explained.

Figure 1:
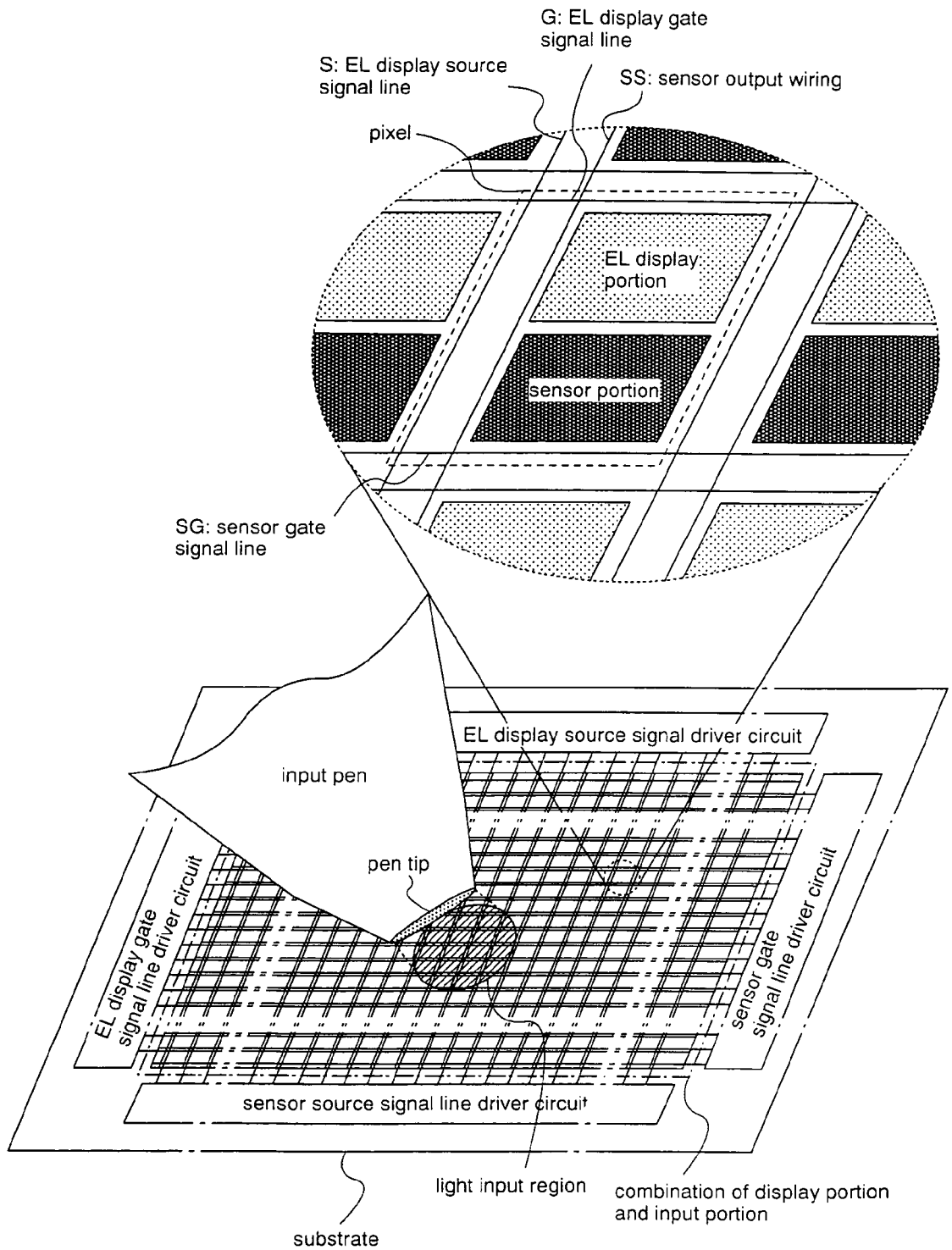
FIG. 1 is a schematic diagram of an information device of the present invention.

FIG. 1 shows a schematic diagram of an information device having a pen input function of the present invention.

A method in which information is input by indicating an inside portion of a combination display portion and input portion in accordance with an input pen which reflects light in a pen tip is explained in the embodiment mode. Each pixel in the combination display portion and input portion is structured by an EL display portion having an EL element, and a sensor portion having a photoelectric conversion element. The EL display portion and the sensor portion are driven by signals from an EL display source signal line driver circuit, an EL display gate signal line driver circuit, a sensor source signal line driver circuit, and a sensor gate signal line driver circuit arranged in the peripheral of the combination display portion and input portion.

The driver circuits (the EL display source signal line driver circuit, the EL display gate signal line driver circuit, the sensor source signal line driver circuit, and the sensor gate signal line driver circuit) are formed on the same substrate as the combination display portion and input portion here.

Signals from the EL display source signal line driver circuit are transmitted to the EL display portion of each pixel by EL display source signal lines S, and signals from the EL display gate signal line driver circuit are transmitted to the EL display portion of each pixel by EL display gate signal lines G.

The sensor source signal line driver circuit reads in signals from the sensor portion of each pixel by sensor output wirings SS, and the sensor gate signal line driver circuit transmits signals to the sensor portion of each pixel by sensor gate signal lines SG.

Note that EL element electric power source lines (electric power source supply lines) arranged in each pixel, sensor electric power source lines, and reset signal lines (reset gate signal lines), and the like are not shown in FIG. 1.

Each pixel of the combination display portion and input portion performs display in its EL display portion. At the same time, light irradiated from the EL display portion is reflected at the pen tip of the input pen, and the light is input to the sensor portion (light input region) in the vicinity of the position indicated by the pen tip. The position indicated by the input pen is thus recognized.

A specific circuit structure of the combination display portion and input portion is explained next.

Figure 2:
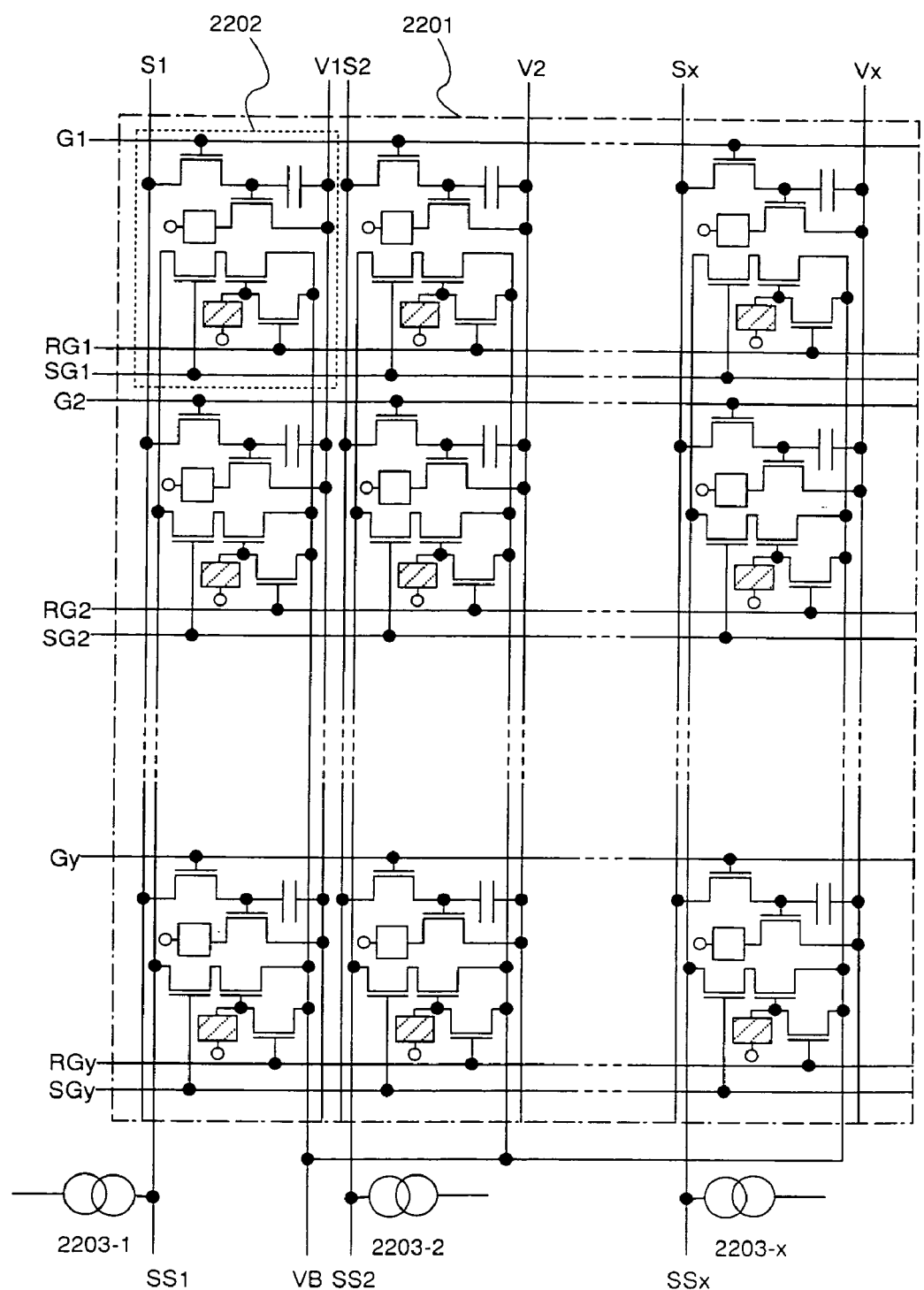
FIG. 2 is a schematic diagram of an upper surface and a cross section of a optical sensor of the present invention.

FIG. 2 is a diagram showing an example of a circuit structure of the combination display portion and input portion.

A combination display portion and input portion 2201 has EL display source signal lines S1 to Sx, EL display gate signal lines G1 to Gy, electric power source supply lines V1 to Vx, sensor output wirings SS1 to SSx, sensor gate signal lines SG1 to SGy, reset gate signal lines RG1 to RGy, and a sensor electric power source line VB.

The combination display portion and input portion 2201 has a plurality of pixels 2202. Each of the plurality of pixels 2202 has one of the EL display source signal lines S1 to Sx, one of the EL display gate signal lines G1 to Gy, one of the electric power source supply lines V1 to Vx, one of the sensor output wirings SS1 to SSx, one of the sensor gate signal lines SG1 to SGy, one of the reset gate signal lines RG1 to RGy, and the sensor electric power source line VB.

The sensor output wirings SS1 to SSx are connected to constant electric current sources 2203-1 to 2203-x, respectively.

Figure 3:
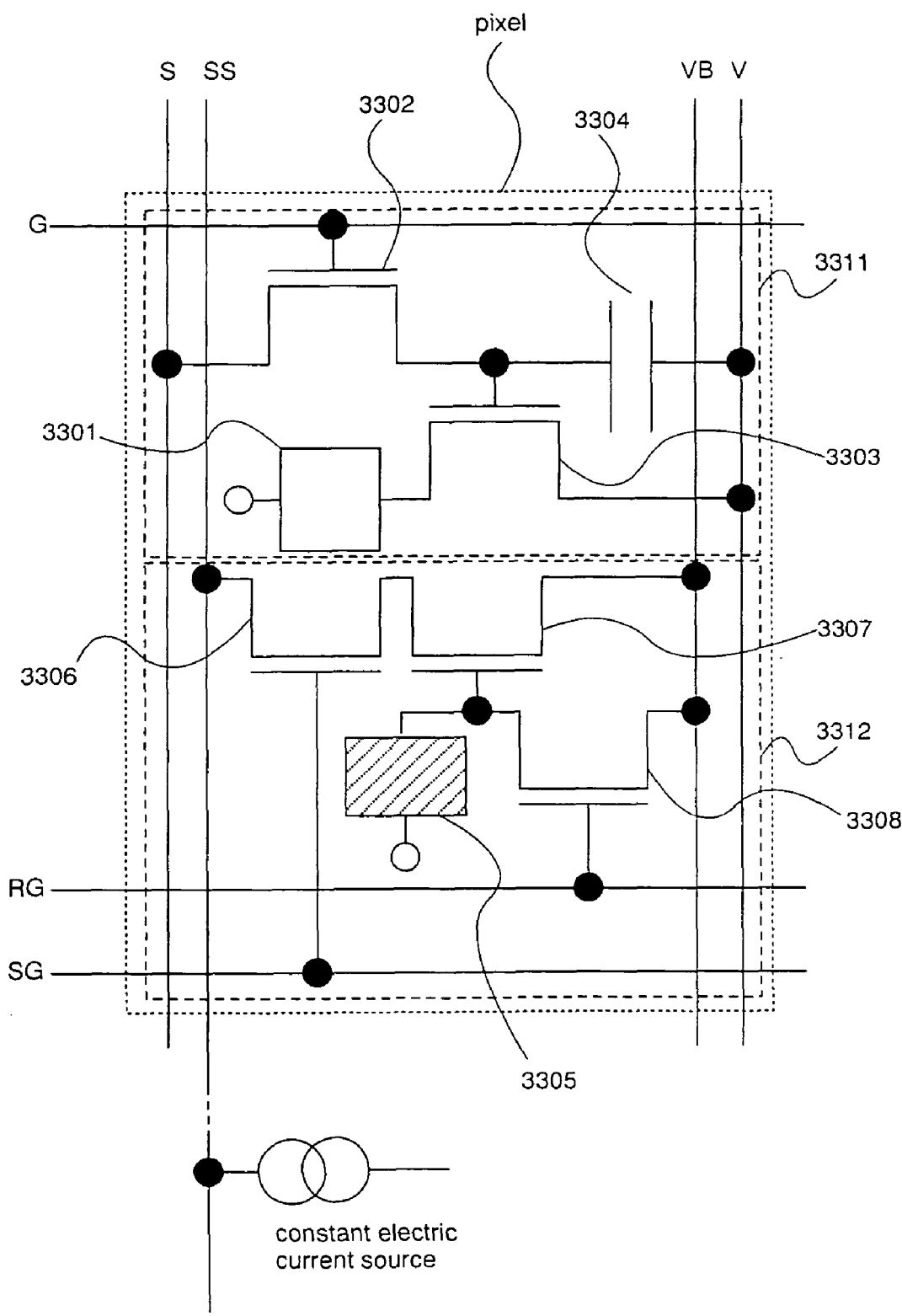
FIG. 3 is a circuit diagram of a pixel portion of a display panel of an information device of the present invention having an attached image sensor.

A detailed structure of the pixels 2202 of FIG. 2 is shown in FIG. 3. Note that the EL display source signal line S shows one of the EL display source signal lines S1 to Sx, and that the EL display gate signal line G shows one of the EL driver gate signal lines G1 to Gy. In addition, an electric power source supply line V shows one of the electric power source supply lines V1 to Vx. The sensor output wiring SS shows one of the sensor output wirings SS1 to SSx, and the sensor gate signal line SG shows one of the sensor gate signal lines SG1 to SGy.

The pixel has an EL display portion 3311 and a sensor portion 3312.

The EL display portion 3311 is structured by an EL element 3301, a switching TFT 3302, an EL driver TFT 3303, and a capacitor 3304. Note that it is not always necessary to form the capacitor 3304 provided that a parasitic capacitance of a gate electrode of the EL driver TFT 3303 is actively utilized.

A gate electrode of the switching TFT 3302 is connected to the EL display gate signal line G, one of a source region and a drain region of the switching TFT 3302 is connected to the EL display source signal line S, and the other is connected one electrode of the capacitor 3304 and to the gate electrode of the EL driver TFT 3303. The other electrode of the capacitor 3304 is connected to the electric power source supply line V. One of a source region and a drain region of the EL driver TFT 3303 is connected to the electric power source supply line V, and the other is connected to the EL element 3301.

Among an anode and a cathode of the EL element 3301, the one connected to the source region or the drain region of the EL driver TFT 3303 becomes a pixel electrode, and the one not connected to the source region or the drain region of the EL driver TFT 3303 becomes an opposing electrode.

The sensor portion 3312 is structured by a photodiode 3305, a selection TFT 3306, a buffer TFT 3307, and a reset TFT 3308.

A Schottky structure photodiode in which a photoelectric conversion layer is sandwiched between an anode electrode and a cathode electrode is used as the structure of the photodiode 3305 in the embodiment mode.

Light made incident to the photodiode is absorbed by the photoelectric conversion layer and forms a carrier. The amount of the carrier formed by this light depends upon the amount of light absorbed by the photoelectric conversion layer.

Although a photodiode having the above stated structure is used as the photoelectric conversion element for converting light to an electric signal here, there are no limitations imposed upon this structure, and PIN photodiodes, PN photodiodes, avalanche diodes, and the like can also be used.

Note that PIN photodiodes are structured by a p-type semiconductor layer, an n-type semiconductor layer, and an i-type (intrinsic) semiconductor layer sandwiched between the p-type semiconductor layer and the n-type semiconductor layer. The i-type semiconductor layer is also referred to as a photoelectric conversion layer here.

Further, the light absorptivity of the photoelectric conversion layer can be increased by using an amorphous semiconductor such as an amorphous silicon film as the photoelectric conversion layer of these photodiodes.

In addition, a photoelectric conversion element having a photoelectric conversion layer structured from an organic material, or the like may also be used as the photoelectric conversion element.

A gate electrode of the selection TFT 3306 is connected to the sensor gate signal line SG, one of a source region and a drain region of the selection TFT 3306 is connected to the sensor output wiring SS, and the other is connected to a source region or a drain region of the buffer TFT 3307. Among the source region and the drain region of the buffer TFT 3307, the one not connected to the selection TFT 3306 is connected to the sensor electric power source line VB. A gate electrode of the reset TFT 3308 is connected to the reset gate signal line RG, one of a source region and a drain region of the reset TFT 3308 is connected to the reset electric power source line VB, and the other is connected to a gate electrode of the buffer TFT 3307 and to the photodiode 3305.

The sensor electric power source line VB is maintained at a fixed electric potential (standard electric potential). The sensor output wiring SS is connected to a constant electric current source.

Note that circuits having known structures may be used as the EL display source signal line driver circuit, the sensor source signal line driver circuit, the EL display gate signal line driver circuit, and the sensor gate signal line driver circuit.

Figure 17:
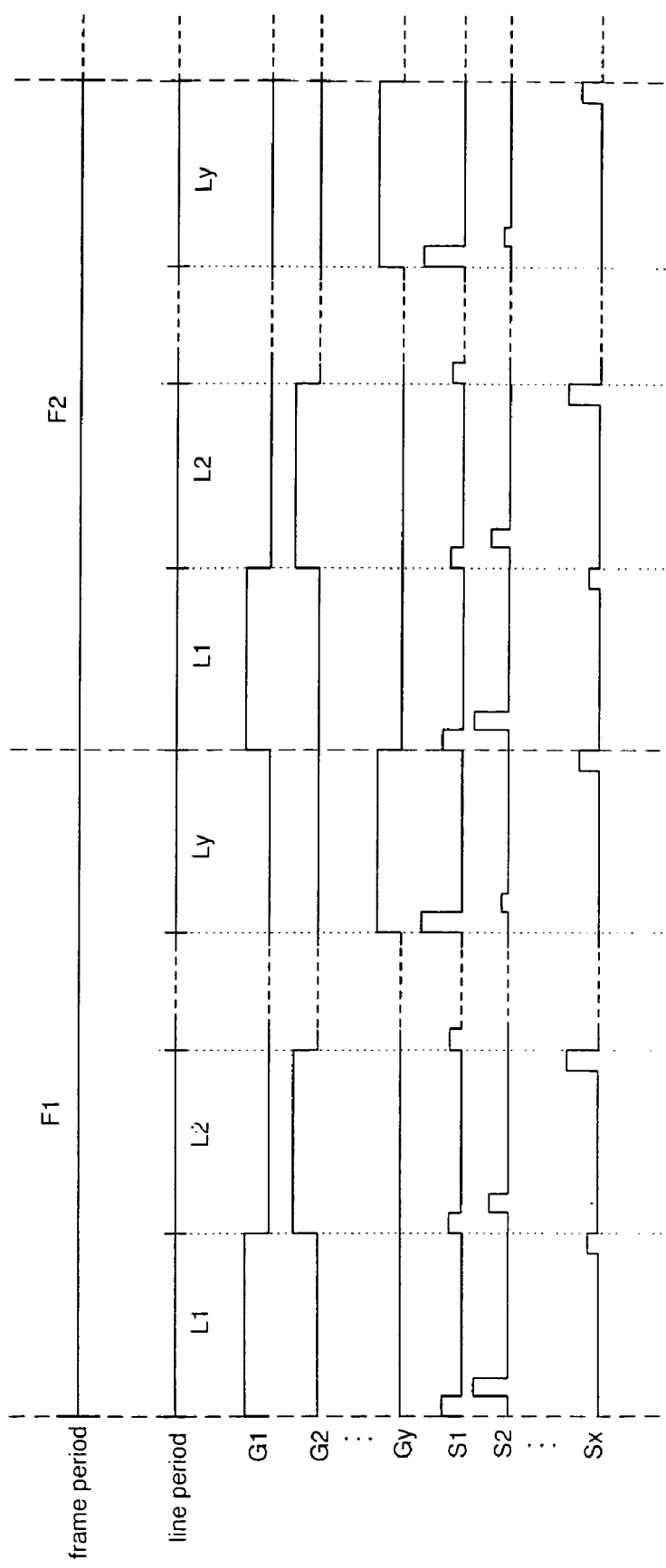
FIG. 17 is a diagram showing a timing chart for driving an information device of the present invention.
Figure 18:
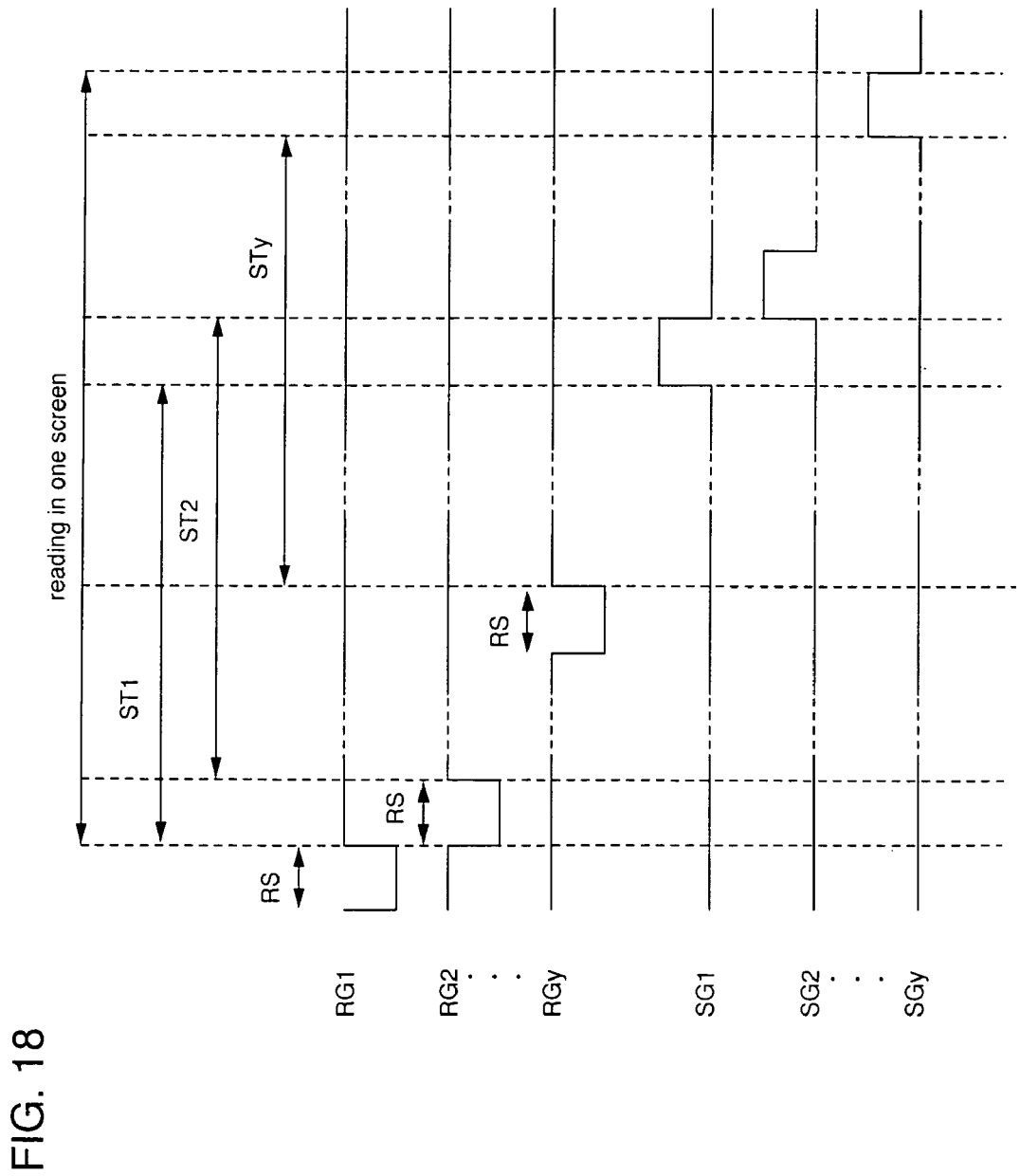
FIG. 18 is a diagram showing a timing chart for driving an information device of the present invention.

A method of operation of the combination display portion and pixel portion having the above structure is explained using the circuit diagrams of FIG. 2 and FIG. 3, and the timing charts of FIG. 17 and FIG. 18.

First, a method of operating the EL display portion is explained using FIG. 2, FIG. 3, and FIG. 17.

Note that a method of performing display in which an analog signal is input to the source signal lines S1 to Sx (hereafter referred to as an analog method) is explained here.

The switching TFT 3302 and the EL driver TFT 3303 are n-channel TFTs here, but the switching TFT 3302 and the EL driver TFT 3303 may each be either an n-channel TFT or a p-channel TFT. However, in order to have a fixed source electric potential and the desired operation when the EL element 3301 anode is the pixel electrode, it is preferable that the EL driver TFT 3303 be a p-channel TFT. Conversely, it is preferable that the EL driver TFT 3303 be an n-channel TFT for cases in which the cathode of the EL element 3301 is the pixel electrode.

All of the switching TFTs 3302 connected to the EL display gate signal line G1 are placed in a conductive state by a signal input to the EL display gate signal line G1.

A period during which a certain one of the EL display gate signal lines is selected is referred to as one line period. In particular, a period during which the EL display gate signal line G1 is selected is referred to as a first line period L1. Analog signals are input to the EL display source signal lines S1 to Sx in order during the line period L1. The voltage of the analog signals input to the EL display source signal lines is applied to the capacitor 3304 and to the gate electrode of the EL driver TFT 3303. The EL driver TFT 3303 causes an electric current between the source and the drain and corresponding to the voltage of the analog signal applied to the gate electrode to flow in the EL element 3301 from the electric power source supply line V. The EL element 3301 emits light having a brightness corresponding to the electric current.

Next, the EL display gate signal line G2 is selected, and all of the switching TFTs 3302 connected to the EL display gate signal line G2 are placed in a conductive state. A second line period L2 thus begins. Signal voltages are then input in order to the EL display source signal lines S1 to Sx. The signal voltage is applied to the gate electrode of the EL driver TFTs 3303, and an electric current between the source and the drain corresponding to the voltage of the analog signal applied to the gate electrode flows in the EL element 3301 from the electric power source supply line V. The EL element 3301 emits light at a brightness corresponding the electric current.

One frame period F1 is completed by repeating the above operations for all of the EL display gate signal lines G1 to Gy. A second frame period F2 begins next, and one image is displayed by repeating these operations.

A method of operating the sensor portion is explained next using FIG. 2, FIG. 3, and FIG. 18.

The reset TFT 3308 is an n-channel TFT, the buffer TFT 3307 is a p-channel TFT, and the selection TFT 3306 is an n-channel TFT here, but the reset TFT 3308, the buffer TFT 3307, and the selection TFT 3306 may each be n-channel TFTs or p-channel TFTs. Note that it is preferable that the polarities of the reset TFT 3308 and the buffer TFT 3307 be opposites.

First, all of the reset TFTs 3308 connected to the reset gate signal line RG1 are placed in a conductive state by a reset gate signal line RG1 signal. The reset gate signal line RG1 is assumed to be selected at this time. Note that all of the reset TFTs 3308 connected to the other reset gate signal lines RG2 to RGy are in non-conductive states. The electric potential of the sensor electric power source line VB in a first pixel line is applied to the gate electrode of the buffer TFT 3307 through the reset TFT 3308. A reverse bias voltage is thus applied between the electrodes of the photodiode 3305. At this point, the source region of the buffer TFT 3307 is maintained at an electric potential in which the electric potential difference between the source region and the gate region of the buffer TFT 3307 is subtracted from the electric potential of the sensor electric power source line VB (standard electric potential).

All of the selection TFTs 3306 connected to the sensor gate signal line SG1 are in non-conductive states at this time in accordance with the sensor gate signal line SG1 signal.

A period during which the reset gate signal lines are selected is referred to as a reset period RS in this specification.

Next, the reset gate signal line RG1 signal changes, and all of the reset TFTs 3308 connected to the reset gate signal line RG1 are placed in a non-conductive state. The reset gate signal line is assumed to be unselected at this time. If light is irradiated to the photodiode 3305, then an electric current flows between the electrodes of the photodiode 3305, and the reverse bias voltage between the electrodes of the photodiode 3305 applied during the reset period becomes lower. All of the selection TFTs 3306 connected to the sensor gate signal line SG1 are then placed in a conductive state in accordance with the signal input to the sensor gate signal line SG1.

A period from when the reset gate signal line is placed in an unselected state until the selection TFT corresponding to the pixels of the same line is selected is referred to as a sampling period ST. In particular, a period from when the reset gate signal line RG1 is placed in an unselected state until the selection gate signal line SG1 is selected is referred to as a first sampling period ST1.

The reverse bias voltage between the electrodes of the photodiode 3305 becomes smaller as time passed during the sampling period ST1. The degree at which the reverse bias voltage is reduced depends upon the intensity of light irradiated to the photoelectric conversion layer of the photodiode 3305. The electrode of the photodiode 3305 not connected to the gate electrode of the buffer TFT 3307 is maintained at a fixed electric potential here. The electric potential of the electrode of the photodiode 3305 connected to the gate electrode of the buffer TFT 3307 therefore drops.

The electric potential drop causes the electric potential of the gate electrode of the buffer TFT 3307 to fall.

The source regions of the buffer TFTs 3307 of each pixel are connected to the constant electric current sources 2203-1 to 2203-x, respectively, through the drain and source of the selection TFTs 3306 here, and therefore the buffer TFTs 3307 work as source followers. Consequently, the voltage between the gate and the source of the buffer TFTs 3307 are always maintained equal. If the electric potential of the gate electrode of the buffer TFT 3307 changes due to changes in the electric potential between the electrodes of the photodiode 3305, then the electric potential of the source region of the buffer TFT 3307 also changes by the same amount. The sensor gate signal line SG1 is selected after the sampling period ST1, and changes in the electric potential of the source region of the buffer TFTs 3307 are output to the sensor output signal wirings SS1 to SSx.

The sensor gate signal line SG1 is then placed in an unselected state.

On the other hand, the reset gate signal line RG2 is selected when the reset gate signal line RG1 is placed in an unselected state. All of the reset TFTs 3308 connected to the reset gate signal line RG2 become conductive, and a second line reset period RS begins. The reset gate signal line RG2 then is placed in an unselected state and a second line sampling period ST2 begins. Note that although the first sampling period ST1 and the second sampling period ST2 have different starting times, they have the same length.

The reverse bias voltage between the electrodes of the photodiodes also similarly drops during the second sampling period ST2 in correspondence with the intensity of light input to the sensor portions of each pixel. All of the selection TFTs 3306 connected to the sensor gate signal line SG2 become conductive in accordance with the sensor gate signal line SG2 signal after the second sampling period ST2. Then, changes in the electric potential between the electrodes of the photodiodes 3305 input to the gate electrodes of the buffer TFTs 3307 are output to the sensor output wirings SS1 to SSx as changes in the electric potential of the source regions of the buffer TFTs 3307.

The sensor gate signal line SG2 is then placed in an unselected state.

By repeating the above operations for all of the sensor gate signal lines SG1 to SGy, the intensity of light input to all of the sensor portions 3312 of the pixels of the combination display portion and input portion 2201 is read in as corresponding voltage signals.

The EL display portion thus performs image display and at the same time the light reflected in the pen tip of the input pen is detected in the sensor portion. The coordinates of the pixels into which light reflected from the pen tip of the input pen is input can thus be specified. The position indicated by the input pen can therefore be specified.

EMBODIMENTS

Embodiments of the present invention are discussed below.

Embodiment 1

Figure 4:
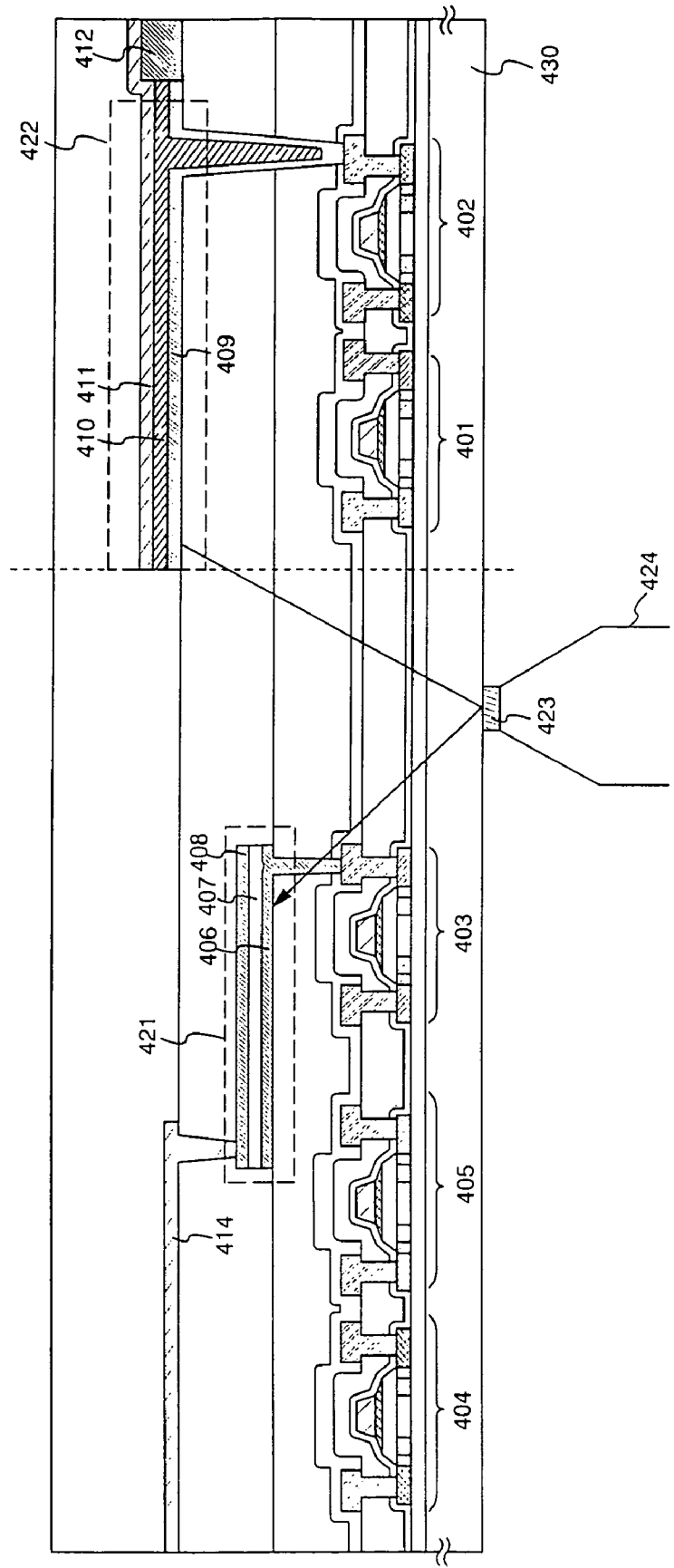
FIG. 4 is a cross sectional diagram of an information device of the present invention.

An example of manufacturing an information device of the present invention discussed in the embodiment mode is explained in Embodiment 1 using the cross sectional diagram of FIG. 4. Note that the pixel structure is similar to that shown in FIG. 3 in the embodiment mode.

Reference numeral 401 denotes a switching TFT, reference numeral 402 denotes an EL driver TFT, reference numeral 403 denotes a reset TFT, reference numeral 404 denotes a buffer TFT, and reference numeral 405 denotes a selection TFT.

Further, reference numeral 406 denotes an anode electrode, 407 denotes a photoelectric conversion layer, and reference numeral 408 denotes a cathode electrode. A photodiode 421 is formed by the anode electrode 406, the photoelectric conversion layer 407, and the cathode electrode 408. Reference numeral 414 denotes a sensor wiring, and the sensor wiring is electrically connected to the cathode 408 and to an external electric power source. Furthermore, the anode electrode 406 of the photodiode 421 and a drain region of the reset TFT 403 are electrically connected.

The anode electrode 406 of the photodiode 421 is formed by a material having transparent properties here.

Reference numeral 409 denotes a pixel electrode (anode), reference numeral 410 denotes an EL layer, and reference numeral 411 denotes an opposing electrode (cathode). An EL element 422 is formed by the pixel electrode (anode) 409, the EL layer 410, and the opposing electrode (cathode) 411. Note that reference numeral 412 denotes a bank, and that the bank separates the EL layers 410 of mutually adjacent pixels.

The pixel electrode 409 of the EL element 422 is formed by a material having transparent properties here.

The EL element 422 irradiates light to a substrate 430 side in FIG. 4. A reflection plate 423 of a pen tip of an input pen 424 approaches from the side of the substrate 430 on which components such as TFTs are not formed. A portion of the light irradiated from the EL elements 422 of the pixels is thus reflected by the reflection plate 423 of the pen tip of the input pen 424, and is input to the photoelectric conversion layers 407 of the photodiodes 421 of the sensor portions of the pixels in the vicinity of the position which the input pen 424 contacts. The position indicated by the pen tip of the input pen 424 can therefore be specified.

The switching TFT 401, the reset TFT 403, and the selection TFT 405 are all n-channel TFTs in Embodiment 1. Further, the EL driver TFT 402 and the buffer TFT 404 are p-channel TFTs. Note that the present invention is not limited by this structure. The switching TFT 401, the EL driver TFT 402, the buffer TFT 404, the selection TFT 405, and the reset TFT 403 can therefore be n-channel TFTs or p-channel TFTs.

However, for cases in which the source region or the drain region of the EL driver TFT 402 is electrically connected to the anode 409 of the EL element 422, as in Embodiment 1, it is preferable that the EL driver TFT 402 be a p-channel TFT. Conversely, it is preferable that the EL driver TFT 402 be an n-channel TFT when the source region or the drain re ion of the EL driver TFT 402 is electrically connected to the cathode of the EL element 422.

Further, for cases in which the anode electrode 406 of the photodiode 421 is electrically connected to the reset TFT 403, it is preferable that the reset TFT 403 be an n-channel TFT and that the buffer TFT 404 be a p-channel TFT. Conversely, it is preferable that the reset TFT 403 be a p-channel TFT and that the buffer TFT 404 be an n-channel TFT if the cathode electrode of the photodiode 421 is connected to the reset TFT 403 and the sensor wiring 414 is connected to the anode electrode.

Embodiment 2

Figure 5:
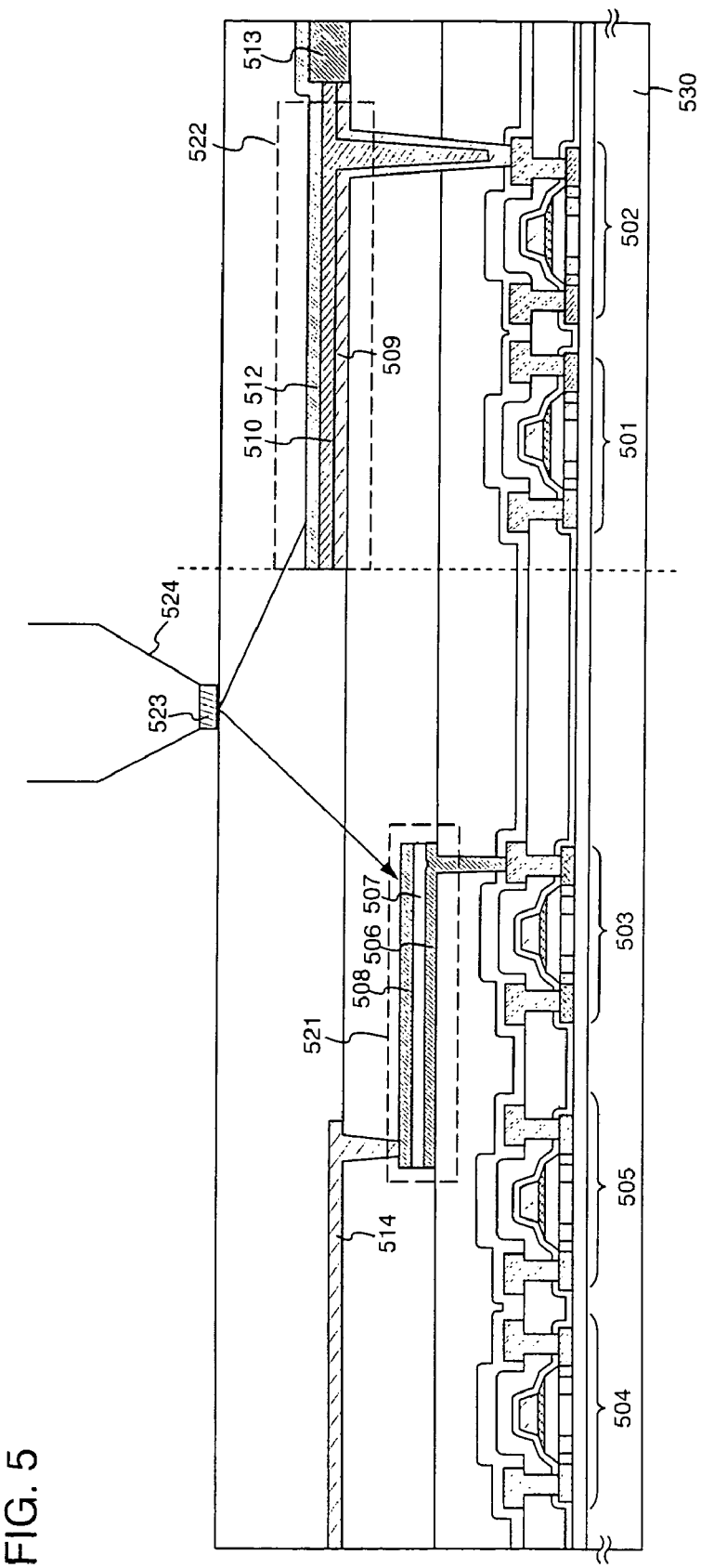
FIG. 5 is a cross sectional diagram of an information device of the present invention.

An example in which the direction of light emitted by an EL element differs in an information device having the structure discussed in Embodiment 1 is explained in Embodiment 2 using FIG. 5. Note that the pixel structure is similar to that shown by FIG. 3 in the embodiment mode.

Reference numeral 501 denotes a switching TFT, reference numeral 502 denotes an EL driver TFT, reference numeral 503 denotes a reset TFT, reference numeral 504 denotes a buffer TFT, and reference numeral 505 denotes a selection TFT.

Further, reference numeral 506 denotes a cathode electrode, reference numeral 507 denotes a photoelectric conversion layer, and reference numeral 508 denotes an anode electrode. A photodiode 521 is formed by the cathode electrode 506, the photoelectric conversion layer 507, and the anode electrode 508. Reference numeral 514 denotes a sensor wiring, and the sensor wiring is electrically connected to the anode 508 and to an external electric power source. Furthermore, the cathode electrode 506 of the photodiode 521 and a drain region of the reset TFT 503 are electrically connected.

The anode electrode 508 of the photodiode 521 is formed by a material having transparent properties here.

Reference numeral 509 denotes a pixel electrode (cathode), reference numeral 510 denotes an EL layer, and reference numeral 512 denotes an opposing electrode (anode). An EL element 522 is formed by the pixel electrode (cathode) 509, the EL layer 510, and the opposing electrode (anode) 512. Note that reference numeral 512 denotes a bank, and that the bank separates the EL layers 510 of mutually adjacent pixels.

The opposing electrode 512 of the EL element 522 is formed by a material having transparent properties here.

The EL element 522 irradiates light in a direction opposite a substrate 530 in the information device having the structure shown in FIG. 5.

A reflection plate 523 is attached to a pen tip of an input pen 524 in order to reflect light.

The EL element 522 irradiates light in a direction opposite the substrate 530 in FIG. 5. The reflection plate 523 of the pen tip of the input pen 524 approaches from the side of the substrate 530 on which components such as TFTs are formed. A portion of the light irradiated from the EL elements 522 of the pixels is thus reflected by the reflection plate 523 of the pen tip of the input pen 524, and is input to the photoelectric conversion layers 507 of the photodiodes 521 of the sensor portions of the pixels in the vicinity of the position indicated by the input pen 524 makes contact. The position indicated by the pen tip of the input pen 524 can therefore be specified.

The switching TFT 501, the EL driver TFT 502, the buffer TFT 504, and the selection TFT 505 are all n-channel TFTs in Embodiment 2. Further, the reset TFT 503 is a p-channel TFT. Note that the present invention is not limited by this structure. The switching TFT 501, the EL driver TFT 502, the buffer TFT 504, the selection TFT 505, and the reset TFT 503 can therefore be n-channel TFTs or p-channel TFTs.

However, for cases in which the source region or the drain region of the EL driver TFT 502 is electrically connected to the cathode 509 of the EL element 522, as in Embodiment 2, it is preferable that the EL driver TFT 502 be an n-channel TFT. Conversely, it is preferable that the EL driver TFT 502 be a p-channel TFT when the source region or the drain region of the EL driver TFT 502 is electrically connected to the anode of the EL element 522.

Further, for cases in which the cathode electrode 506 of the photodiode 521 is electric-ally connected to the reset TFT 503, it is preferable that the reset TFT 503 be a p-channel TFT and that the buffer TFT 504 be a n-channel TFT. Conversely, it is preferable that the reset TFT 503 be an n-channel TFT and that the buffer TFT 504 be a p-channel TFT if the anode electrode of the photodiode 521 is connected to the reset TFT 503 and the sensor wiring 514 is connected to the cathode electrode.

Embodiment 3

The operation method of a combination of display portion and input portion, which is different from that shown in the embodiment mode, is described in this embodiment. The structure of the combination of display portion and input portion is the same as the structure shown in the embodiment mode, and therefore the explanation is omitted and FIGS. 2 and 3 may be referenced. Note that the operation method of the sensor is the same as that shown by the embodiment mode, and FIG. 18 may be referenced.

Figure 16:
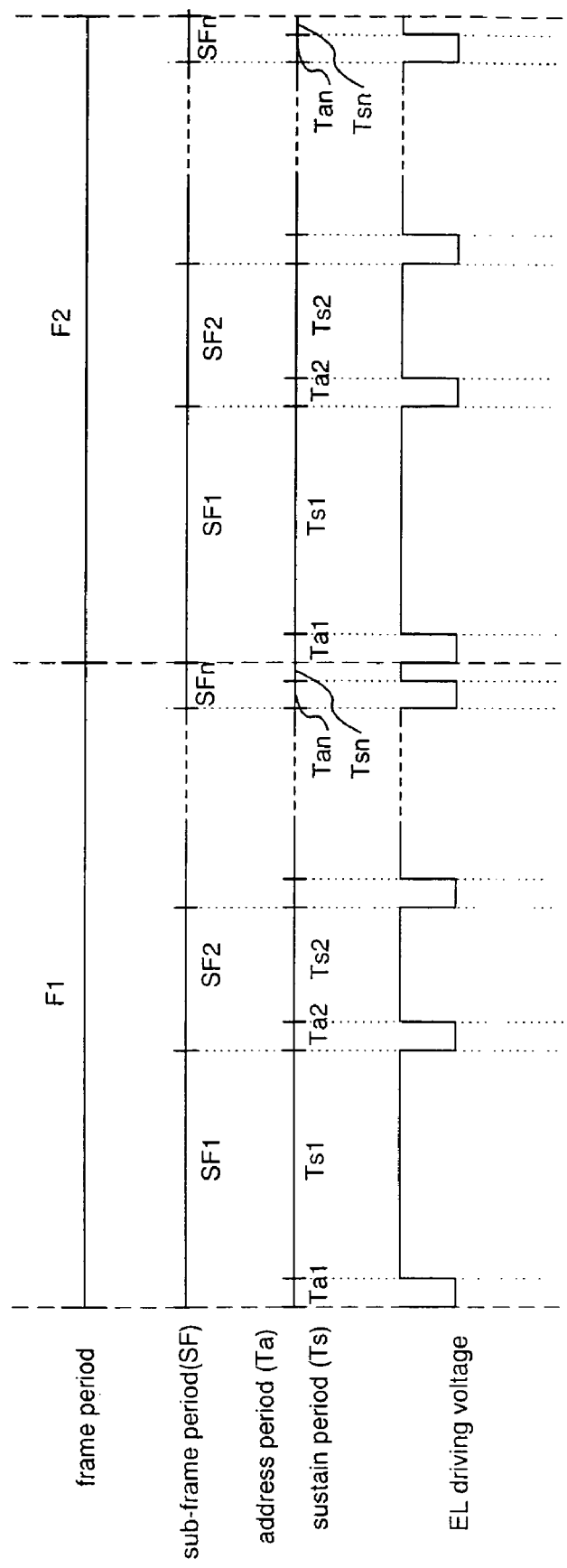
FIG. 16 is a diagram showing a timing chart for driving an information device of the present invention.

The operation method of the EL display portion is different in this embodiment. A timing chart showing operation method of the EL display portion of this embodiment is shown in FIG. 16.

First, one frame period F is divided into N subframe periods SF1 to SFN. The number of subframe periods in one frame period also increases as the number of gray scales increases. Note that, when the combination of display portion and input portion displays an image, one frame period F denotes a period during which the EL display portion of all pixels of the combination of display portion and input portion display one image.

It is preferable that 60 or more frame periods be provided each second for the case of this embodiment. By setting the number of images displayed each second to 60 or greater, it becomes possible to visually suppress image flicker.

The subframe period is divided into an address period Ta and a sustain period Ts. The address period is a period within one subframe period during which a digital video signal is inputted to all pixels. Note that the digital video signal is a digital signal having image information. The sustain period (also referred to as a turn-on period) denotes a period during which EL elements are placed in a state of emitting light or not emitting light in accordance with the digital video signal inputted to the pixels in the address period and display is performed. Note that the digital video signal denotes the digital signal having image information.

The address periods (Ta) of SF1 to SFN are taken as address periods Ta1 to TaN, and the sustain periods (Ts) of SF1 to SFN are taken as sustain periods Ts1 to TsN.

The electric potential of the electric power source supply lines V1 to Vx is maintained at a predetermined electric potential (electric power source potential).

First, the electric potential of the opposing electrode of the EL elements 3301 is maintained at the same height as the electric power source potential in the address period Ta.

Next, all of the switching TFTs 3302 connected to the EL display gate signal line G1 are placed in a conductive state in accordance with a signal inputted to an EL display gate signal G1. The digital video signal is then inputted to the EL display source signal lines S1 to Sx. The digital video signal has "0" or "1" information, and one of the "0" and "1" digital video signals is a signal having a "Hi" voltage, while the other is a signal having a "Lo" voltage.

The digital video signal inputted to the source signal lines S1 to Sx is then inputted to the gate electrodes of the EL driver TFTs 3303 through the switching TFTs 3302 in a conductive state.

All of the switching TFTs 3302 connected to the EL display gate signal line G1 are then placed in a non-conductive state, and all of the switching TFTs 3302 connected to the EL display gate signal line G2 are placed in a conductive state in accordance with a gate signal inputted to the EL display gate signal line G2. The digital video signal is then inputted to the source signal lines S1 to Sx. The digital video signal inputted to EL display the source signal lines S1 to Sx is inputted to the gate electrodes of the EL driver TFTs 3303 through the switching TFTs 3302 in a conductive state.

The above operations are repeated through the EL display gate signal line Gy, and the digital video signal is inputted to the gate electrodes of the EL driver TFTs 3303 of all the pixels, and the address period is completed.

The sustain period Ts begins simultaneously with the completion of the address period Ta. All of the switching TFTs 3302 are in a non-conductive state in the sustain period Ts. The electric potential of the opposing electrodes of all the EL elements 3301 has a height of the electric potential difference between the electric power source potential to the level at which the EL elements 3301 will emit light when the electric potential of the electric power source is applied to the pixel electrodes.

When the digital video signal has "0" information, the EL driver TFT 3303 is placed in a non-conductive state in this embodiment. The voltage at the degree of luminescence of the EL element 3301 does not impressed between the pixel electrode of the EL element 3301 and the opposing electrode. As a result, the EL element 3301 does not emit light when the digital video signal having "0" information is inputted to the pixel.

On the other hand, when the digital video signal has "1" information, the EL driver TFTs 3303 are placed in a conductive state. The electric power source potential is therefore applied to the pixel electrode of the EL element 3301. As a result, the EL element 3301 of the pixel into which the digital video signal having "1" information is inputted emits light.

The EL elements are thus placed in a state in which they emit light or do not emit light in accordance with the information of the digital video signal input to the pixels, and the pixels perform display.

One subframe period is completed at the same time as the sustain period Ts is complete. The next subframe period then appears, and once again the address period Ta begins. The sustain period Ts again beings after the digital video signal is input to all of the pixels. Note that the order of appearance of the subframe periods SF1 to SFN is arbitrary.

Similar operations are then repeated in the remaining subframe periods, and display is performed. After completing all of the N subframe periods, one image is displayed, and one frame period is completed. When one frame period is complete, the subframe period of the next frame period appears, and the above stated operations are repeated.

The lengths of the address periods Ta1 to TaN of the respective n subframe periods are each the same in the present invention. Further, the ratio of lengths of the N sustain periods Ts1,..., Tsn is expressed as Ts1:Ts2:Ts3: ... :Ts(N−1): Tsn=$2^0:2^{-1}:2^{-2}: ... :2^{-(N-2)}:2^{-(N-1)}$.

The gray-scale of each pixel is determined in accordance with during which subframe periods in one frame period the pixel is made to emit light. For example, in the case that Ts1:Ts2:Ts3: ... :Ts (N−1):TsN=$2^0:2^{-1}:2^{-2}: ... :2^{-(N-2)}:2^{-(N-1)}$, when N=8, and taking the brightness of pixels which emit light in all of the sustain periods Ts1 to Ts8 as having a value of 100%. pixels which emit light in Ts1 and Ts2 can express a brightness of 75%, and for a case of selecting Ts3. Ts5, and Ts8, a brightness of 16% can be expressed.

As mentioned above, the technique of displaying image, in which the digital signal is inputted to the source signal lines S1 to Sx and the EL element of the pixel is emitted light, is referred to digital method.

A method of operating the sensor portion is explained next using FIG. 2, FIG. 3, and FIG. 18.

The reset TFT 3308 is an n-channel TFT, the buffer TFT 3307 is a p-channel TFT, and the selection TFT 3306 is an n-channel TFT here, but the reset TFT 3308, the buffer TFT 3307, and the selection TFT 3306 may each be n-channel TFTs or p-channel TFTs. Note that it is preferable that the polarities of the reset TFT 3308 and the buffer TFT 3307 be opposites.

First, all of the reset TFTs 3308 connected to the reset gate signal line RG1 are placed in a conductive state by the reset gate signal line RG1 signal. The reset gate signal line RG1 is assumed to be selected at this time. Note that all of the reset TFTs 3308 connected to the other reset gate signal lines RG2 to RGy are in non-conductive states. The electric potential of the sensor electric power source line VB in a first pixel line is applied to the gate electrode of the buffer TFT 3307 through the reset TFT 3308. A reverse bias voltage is thus applied between the electrodes of the photodiode 3305. At this point, the source region of the buffer TFT 3307 is maintained at an electric potential in which the electric potential difference between the source region and the gate region of the buffer TFT 3307 is subtracted from the electric potential of the sensor electric power source line VB (standard electric potential).

All of the selection TFTs 3306 connected to the sensor gate signal line SG1 are in non-conductive states at this time in accordance with the sensor gate signal line SG1 signal.

The period during which the reset gate signal lines are selected is referred to as the reset period RS in this specification.

Next, the reset gate signal line RG1 signal changes, and all of the reset TFTs 3308 connected to the reset gate signal line RG1 are placed in a non-conductive state. The reset gate signal line is assumed to be unselected at this time. If light is irradiated to the photodiode 3305, then an electric current flows between the electrodes of the photodiode 3305, and the reverse bias voltage between the electrodes of the photodiode 3305 applied during the reset period becomes lower. All of the selection TFTs 3306 connected to the sensor gate signal line SG1 are then placed in a conductive state in accordance with the signal input to the sensor gate signal line SG1.

The period from when the reset gate signal line is placed in an unselected state until the selection TFT corresponding to the pixels of the same line is selected is referred to as the sampling period ST. In particular, the period from when the reset gate signal line RG1 is placed in an unselected state until the selection gate signal line SG1 is selected is referred to as the first sampling period ST1.

The reverse bias voltage between the electrodes of the photodiode 3305 becomes smaller as time passed during the sampling period ST1. The degree at which the reverse bias voltage is reduced depends upon the intensity of light irradiated to the photoelectric conversion layer of the photodiode 3305. The electrode of the photodiode 3305 not connected to the gate electrode of the buffer TFT 3307 is maintained at a fixed electric potential here. The electric potential of the electrode of the photodiode 3305 connected to the gate electrode of the buffer TFT 3307 therefore drops.

The electric potential drop causes the electric potential of the gate electrode of the buffer TFT 3307 to fall.

The source regions of the buffer TFTs 3307 of each pixel are connected to the constant electric current sources 2203-1 to 2203-x, respectively, through the drain and source of the selection TFTs 3306 here, and therefore the buffer TFTs 3307 work as source followers. Consequently, the voltage between the gate and the source of the buffer TFTs 3307 are always maintained equal. If the electric potential of the gate electrode of the buffer TFT 3307 changes due to changes in the electric potential between the electrodes of the photodiode, then the electric potential of the source region of the buffer TFT 3307 also changes by the same amount. The sensor gate signal line SG1 is selected after the sampling period ST1, and changes in the electric potential of the source region of the buffer TFTs 3307 are output to the sensor output wirings SS1 to SSx.

The sensor gate signal line SG1 is then placed in all unselected state.

On the other hand, the reset gate signal line RG2 is selected when the reset gate signal line RG1 is placed in an unselected state. All of the reset TFTs 3308 connected to the reset gate signal line RG2 become conductive, and the second line reset period RS begins. The reset gate signal line RG2 then is placed in an unselected state and the second line sampling period ST2 begins. Note that although the first sampling period ST1 and the second sampling period ST2 have different starting times, they have the same length.

The reverse bias voltage between the electrodes of the photodiodes also similarly drops during the second sampling period ST2 in correspondence with the intensity of light input to the sensor portions of each pixel. All of the selection TFTs 3306 connected to the sensor gate signal line SG2 become conductive in accordance with the sensor gate signal line SG2 signal after the second sampling period ST2. Then, changes in the electric potential between the electrodes of the photodiodes 3305 input to the gate electrodes of the buffer TFTs 3307 are output to the sensor output wirings SS1 to SSx as changes in the electric potential of the source regions of the buffer TFTs 3307.

The sensor gate signal line SG2 is then placed in an unselected state.

By repeating the above operations for all of the sensor gate signal lines SG1 to SGy, the intensity of light input to all of the sensor portions 3312 of the pixels of the combination display portion and input portion 2201 is read in as corresponding voltage signals.

The EL display portions of the pixels do not emit light in address periods Ta1 to TaN for cases in which the combination pixel portion and input portion of the information device of the present invention is operating with the above method of operation. Originally, therefore, if light from the EL elements is reflected by the pen tip of the input pen and input to the photodiodes as shown in Embodiment 1 and in Embodiment 2, the light is not input to the photodiodes of the pixels to which the signal must be input, and the reverse bias voltage between the electrodes of the photodiodes does not drop. In other words, information for specifying the position of the pen tip of the input pen is not input in the address periods Ta1 to TaN.

Further, subframe periods during which the pixels do not emit light exist in the pixels indicated by the pen tip of the input pen in accordance with the gray scale displayed. In other words, originally light is not input to the photodiodes of pixels to which signals should be input during the subframe periods in which the pixels do not emit light, and information for specifying the position of the pen tip of the input pen is not input.

However, the length of a period for reading in one screen of the sensor portion is normally set to be sufficiently longer than the address periods Ta1 to TaN of the EL display portion.

Namely, the lengths of the sampling periods ST1 to STy of the sensor portion of each pixel are set to be sufficiently longer than the lengths of the address periods Ta1 to TaN.

The period during which the EL elements emit light can therefore be sufficiently maintained during the period in which one screen of the sensor portion is read in.

Further, the period for reading in one screen of the sensor portion is generally equal to or longer than one frame period of the EL display portion. Light is therefore irradiated intermittently to the pen tip of the input pen from pixels in the vicinity of the location indicated by the pen tip of the input pen during a period of time whose length corresponds to the sum of the subframe periods during which the EL elements emit light within the period for reading in one screen of the sensor portion. Light can therefore be input to the photodiodes of the pixels in the vicinity of the location indicated by the pen tip of the input pen by using this irradiated light.

The position of the pen tip of the input pen can thus be specified.

Note that it is possible to freely combine the present embodiment with Embodiment 1 and Embodiment 2.

Embodiment 4

An input pen can be used not only to perform information input, but call also be used as an image sensor in an information device of the present invention.

Figure 20:
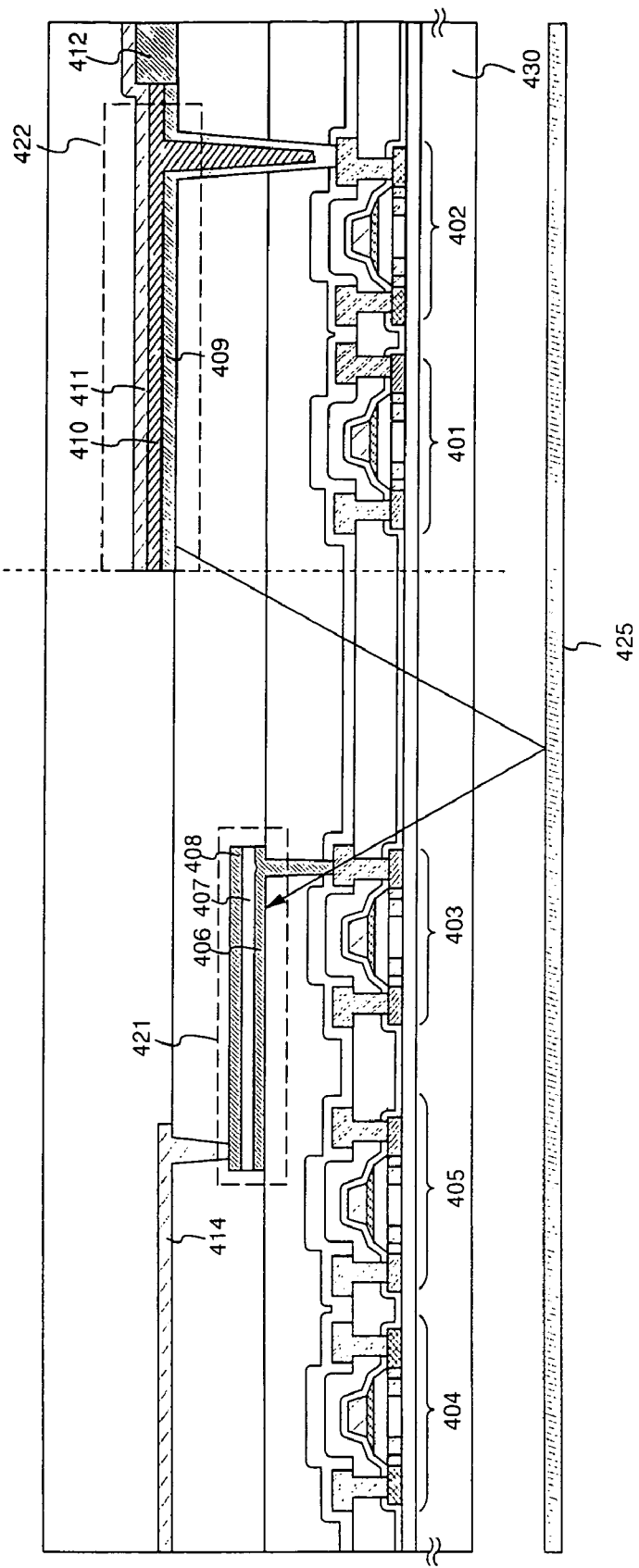
FIG. 20 is a cross sectional diagram of an information device of the present invention.

FIG. 20 is a schematic diagram of a case in which an information device of the present invention is used as an image sensor and reads in information from a surface of an object.

A circuit structure of a combination display portion and input portion of the image device is similar to that of the embodiment mode, and therefore its explanation is omitted here. Further, portions in the schematic diagram of FIG. 20 that are similar to portions in FIG. 4 are shown using the same reference symbols, and their explanation is also omitted here.

A method of driving the combination display portion and input portion can use a technique similar to the technique shown in the embodiment mode and in Embodiment 3, and therefore such explanation is omitted here.

An object to be read (a target object 425) approaches the side, where pen input is performed, of the combination display portion and input portion of the information device of the present invention. The EL elements 422 of each pixel are made to emit light by a technique similar to that shown in the embodiment mode and in Embodiment 3. Light is irradiated to the target object 425 using the light emitted from the EL elements 422. In other words, the EL elements 422 of each pixel are used as illumination devices for reading in information of the target object 425.

It is therefore preferable that the brightness of the light emitted by the EL elements of each pixel all be set to the same level when using the image device of the present invention as an image sensor.

Namely, analog signals input from EL source signal lines in each of the pixels are set to be equal when driving the EL elements of each pixel in accordance with an analog method like that shown in the embodiment mode.

On the other hand, all of the pixels are made to emit light for periods of time having the same length within one frame period for cases of driving the EL elements of each pixel by a digital method such as that shown in Embodiment 3. Note that in order to irradiate light as continuously as possible, it is preferable that the EL elements of each of the pixels be set so as to emit light during all sustain periods within-one frame period.

The light irradiated to the target object 425 is thus reflected by the surface of the target object 425 to be read, and is input to the photodiodes 421 of the sensor portion of each pixel. The input light is converted into electric signals, is read out by sensor driver circuits (a sensor source signal line driver circuit and a sensor gate signal line driver circuit), and information regarding the surface of the target object 425 can be obtained as an image.

Although the explanation is performed here using an information device having the structure shown in Embodiment 1, the target object can also approach from the side of the combination display portion and pixel portion substrate on which TFTs are formed using an information device having the structure shown in FIG. 5 in Embodiment 2. Information regarding the surface of the target object can also be read in.

Note that it is possible to implement the present embodiment by freely combining it with any of Embodiments 1 to 3.

Embodiment 5

The manufacturing method of the combination of display portion and input portion of the information device of the present invention is described with references FIGS. 10A to 14B.

Referring to FIG. 10A, a substrate 200 is prepared first. The substrate 200 in this embodiment is made of glass such as barium borosilicate glass represented by the Corning # 7059 glass or the Corning # 1737 glass that are products of Corning Incorporated, or alumino borosilicate glass. The material of the substrate 200 is not limited as long as it is a light transmissive substrate, and a quartz substrate may be used. Alternatively, a plastic substrate may be used if it has a heat resistance that can endure the treatment temperature in this embodiment.

In addition, a stainless substrate may be used as a substrate 200. However, the stainless substrate is effective only when the light emitting from the EL element is radiating to opposite direction against the substrate 200, because the stainless substrate is not transparent.

Next, an insulating film is formed from silicon oxide on the substrate 200 so as to cover the substrate 200. The insulating film may be a silicon oxide film, a silicon nitride film or a silicon oxynitride film. For example, it may be a laminate of a silicon oxynitride film formed by plasma CVD from $SiH_4$, $NH_3$ and $N_2O$ to a thickness of 250 to 800 nm (preferably 300 to 500 nm) and a hydrogenated silicon oxynitride film similarly formed from $SiH_4$ and $N_2O$ to a thickness of 250 to 800 nm (preferably 300 to 500 nm). The insulating film here uses silicon oxide and is formed into a single layer having a thickness of 0.5 to 1.5 µm. The material of the insulating film is not limited to silicon oxide.

The insulating film is then polished by CMP to form a planarization insulating film 201. A known CMP technique can be used here. Slurry generally used in polishing an oxide film is a solid-liquid dispersion system slurry obtained by dispersing a 100 to 1000 nmφ abrasive in a solution containing a reagent such as a PH adjuster. This embodiment uses a silica slurry (PH=10 to 11) in which 20 wt % of fumed silica particles obtained by pyrolyzing silicon chloride gas are dispersed in a solution added with potassium hydroxide.

After forming the planarization insulating film 201, semiconductor layers 202 to 206 are formed on the planarization insulating film 201. The semiconductor layers 202 to 206 are obtained by forming a semiconductor film having an amorphous structure through a known method (sputtering LPCVD or plasma CVD), crystallizing the amorphous semiconductor film through a known crystallization processing (laser crystallization, thermal crystallization, or thermal crystallization that uses a catalyst such as nickel), and patterning the obtained crystalline semiconductor film into a desired shape. The semiconductor layers 202 to 206 each has a thickness of 25 to 80 nm (preferably 30 to 60 nm). No limitation is put on the material of the crystalline semiconductor film but silicon, a silicon germanium alloy ($Si_xGe_{1-x}$(X=0.0001 to 0.02)), or the like is preferable. In this embodiment, an amorphous silicon film is formed by plasma CVD to a thickness of 55 nm and a solution containing nickel is then retained on the amorphous silicon film. Dehydrogenation (at 500° C. for an hour) is performed on the amorphous silicon film before thermal crystallization (at 550° C. for four hours) is conducted. Then the film is subjected to laser annealing for improving the crystallinity to obtain the crystalline silicon film. The crystalline silicon film is patterned by using photolithography to form the semiconductor layers 202 to 206.

The semiconductor layers 202 to 206 then may be doped with a minute amount of impurity element (boron or phosphorus) for controlling the threshold of the TFTs.

When laser crystallization is chosen to form the crystalline semiconductor film, a pulse oscillation or continuous wave excimer laser, YAG laser or $YVO_4$ laser can be used. In using such laser, laser light emitted from a laser oscillator is preferably collected by an optical system into a linear beam before irradiating the semiconductor film. Conditions for the crystallization may suitably be chosen by an operator. However, appropriate conditions in the case of using an excimer laser include setting the pulse oscillation frequency to 300 Hz and setting the laser energy density to 100 to 400 $mJ/cm^2$ (typically 200 to 300 $mJ/cm^2$). If the laser is an YAG laser, its second harmonic is used to set the pulse oscillation frequency to 30 to 300 kHz and the laser energy density is appropriately set to 300 to 600 $mJ/cm^2$ (typically 350 to 500 $mJ/cm^2$). The laser light is then collected into a linear beam with a width of 100 to 1000 µm, for example, 400 µm, and the substrate is irradiated with the linear beam until the laser scanning covers the entire surface of the substrate. The overlap ratio of the linear laser light beams in this case is 50 to 98%.

A gate insulating film 209 is formed next to cover the semiconductor layers 202 to 206. The gate insulating film 209 is formed by plasma CVD or sputtering from an insulating film containing silicon to a thickness of 40 to 150 nm. In this embodiment, silicon oxynitride film (composition ratio: Si=32%. O=59%, N=7%, H=2%) with a thickness of 110 nm is formed bad plasma CVD. The gate insulating film is not limited to a silicon oxynitride film, of course, but a single layer or a laminate layer of other silicon-containing films can be used as the gate insulating film.

When a silicon oxide film is used, the film is formed by plasma CVD while mixing TEOS (tetraethyl orthosilicate) with $O_2$, and discharging at a reaction pressure of 40 Pa, a substrate temperature of 300 to 400° C., and a high frequency (13.56 MHz) power density of 0.5 to 0.8 W/cm$^2$. The silicon oxide film thus formed displays excellent characteristics as the gate insulating film through a subsequent thermal annealing at 400 to 500° C.

Next, as shown in FIG. 10A, a first conductive film 210a with a thickness of 20 to 100 nm and a second conductive film 210b with a thickness of 100 to 400 nm are layered on the gate insulating film 209. In this embodiment, the first conductive film 210a is a 30 nm thick TaN film, on which a W film having a thickness of 370 nm and serving as the second conductive film 210b is placed to form a laminate. The TaN film is formed by sputtering with Ta as the target in atmosphere containing nitrogen. The W film is formed by sputtering with W as the target. Alternatively, the W film may be formed by thermal CVD using tungsten hexafluoride ($WF_6$). In either case, the film has to be lowered in resistivity in order to use it as the gate electrode, and the resistivity of the W film is desirably 20 μΩcm or lower. The resistivity of the W film can be lowered when the grain size in the film is increased. However, if there are many impurity elements such as oxygen in the W film, crystallization is hindered and the resistivity is increased. For that reason, the W film in this embodiment is formed by sputtering while using a high purity W target (purity: 99.9999%) and taking a great care to avoid mixing-in of impurities from the air during the film formation. As a result, the W film can have a reduced resistivity of 9 to 20 μΩcm.

The first conductive film 210a and the second conductive film 210b in this embodiment are formed from TaN and W, respectively, but the materials thereof are not particularly limited. Each of them call be formed of all element selected from the group consisting of Ta, W, Ti, Mo, Al, Cu, Cr and Nd, or of an alloy material or compound material mainly containing one or more of the elements above. A semiconductor film, typically a polycrystalline silicon film, doped with an impurity element such as phosphorus may also be used. An AgPdCu alloy is also included in the usable materials. The following combinations of the first conductive film and the second conductive film are also suitable; a tantalum (Ta) film for the first conductive film and a W film for the second conductive film, a titanium nitride (TiN) film for the first conductive film and a W film for the second conductive film, a tantalum nitride (TaN) film for the first conductive film and an Al film for the second conductive film, and a tantalum nitride (TaN) film for the first conductive film and a Cu film for the second conductive film.

A resist mask 211 is next formed by photolithography to carry out a first etching treatment for forming electrodes and wirings (FIG. 10B). The first etching treatment employs first etching conditions and second etching conditions. In this embodiment, the first etching conditions include: using ICP (Inductively Coupled Plasma) etching; using as an etching gas $CF_4$, $Cl_2$ and $O_2$ and setting the ratio of their respective flow rates to 25/25/10 (sccm); and giving an RF (13.56 MHz) power of 500 W to a coil-formed electrode at a pressure of 1 Pa to generate plasma. Used here is a dry etching apparatus adopting ICP (model: E645-ICP), a product of Matsushita Electric Industrial Co., Ltd. The substrate side (sample stage) also receives an RF (13.56 MHz) power of 150 W so that a substantially negative self-bias voltage is applied. The W film is etched under the first etching conditions, so that the first conductive layer is tapered around the edge. The etching rate for etching the W film under the first etching conditions is 200.39 nm/min., whereas the etching rate for etching the TaN film under the first etching conditions is 80.32 nm/min. Accordingly the selective ratio of W to TaN is about 2.5. The taper angle of the W film is about 26° under the first etching conditions.

In the first etching treatment above, the first conductive layer and the second conductive layer are tapered around their edges owing to a proper shape of the resist mask 211 and the effect of the bias voltage applied to the substrate side. The angle of the tapered portions is appropriately 15 to 45°. Thus formed through the first etching treatment are conductive layers 212 to 216 having a first shape (first conductive layers 212a to 216a and second conductive layers 212b to 216b) which are formed from the first conductive layer and the second conductive layer. Reference symbol 217 denotes a gate insulating film, and regions of the gate insulating film which are not covered with the conductive layers 212 to 216 having the first shape are etched by about 20 to 50 nm, thereby forming thinned regions.

Without removing the resist mask, a second etching treatment is conducted next (FIG. 10C). In the etching here, an etching gas obtained by mixing $CF_4$, $Cl_2$ and $O_2$ is used, ratio of their respective flow rates is set to 25/25/10 (sccm), and an RF (13.56 MHz) power of 500 W is given to a coil-formed electrode at a pressure of 1 Pa to generate plasma. The substrate side (sample stage) also receives an RF (13.56 MHz) power of 20 W so that a substantially negative self-bias voltage is applied. The etching rate for etching the W film in the second etching treatment is 124.62 nm/min., whereas the etching rate for etching the TaN film in the second etching treatment is 20.67 nm/min., and the selective ratio of W to TaN is 6.05. Accordingly, the W film is selectively etched. The taper angle of the W film is 70° after receiving the second etching treatment. Through the second etching treatment, second conductive layers 218b to 222b are formed. On the other hand, the first conductive layers 218a to 222a are barely etched. Denoted by 223 is a gate insulating film, and regions of the (sate insulating film which are not covered with the conductive layers 218 to 222 having the first shape are etched by about 20 to 50 nm, thereby forming thinned regions.

The first conductive layer 218a and the second conductive layer 218b together form an electrode, which serves as a buffer TFT of an n-channel TFT to be formed in a later step. The first conductive layer 219a and the second conductive layer 219b together form an electrode, which serves as a selective TFT of an n-channel TFT to be formed in a later step. Similarly, the first conductive layer 220a and the second conductive layer 220b together form Ian electrode, which serves as a reset TFT of a p-channel TFT to be formed in a later step. The first conductive layer 221a and the second conductive layer 221b together form an electrode, which serves as a switching TFT of an n-channel TFT to be formed in a later step. The first conductive layer 222a and the second conductive layer 222b together form an electrode, which serves as an EL driver TFT of a p-channel TFT to be formed in a later step.

Figure 11A:
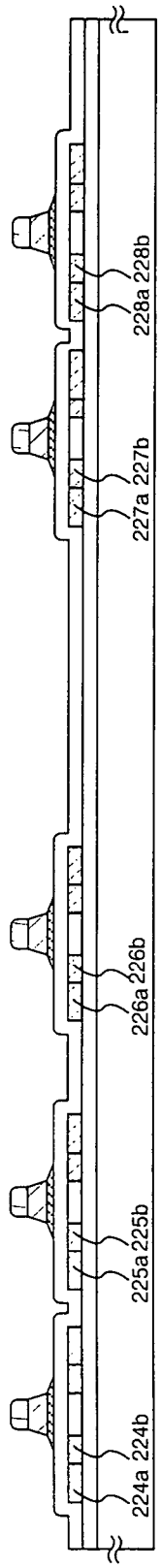
FIGS. 11A to 11C are diagrams showing the method of manufacturing all information device of the present invention.

A first doping treatment is performed next to obtain the state of FIG. 11A. In the doping, the second conductive layers 218b to 222b are used as masks against an impurity element and semiconductor layers below the tapered portions of the first conductive layers 218a to 222a are doped with the impurity element. This embodiment uses plasma doping while choosing phosphorus (P) for the impurity element, setting the dose to $3.5 \times 10^{12}$, and setting the acceleration voltage to 90 keV. Thus formed in a self-aligning manner are low concentration impurity regions 224a to 228a, which do not overlap the first conductive layers, and low concentration impurity regions 224b to 228b, which overlap the first conductive layers. The concentration of phosphorus (P) in the low concentration impurity regions 224b to 228b is $1\times10^{17}$ to $1\times10^{18}$ atoms/cm$^3$, and the concentration shows gentle gradient in accordance with the graduated thickness of the tapered portions of the first conductive layers 218a to 222a. In the semiconductor layers that overlap the tapered portions of the first conductive layers 218a to 222a, the concentration of the impurity element is slightly decreased toward the centers from the edges of the tapered portions of the first conductive layers 218a to 222a. However, overall, the concentration is almost uniform.

Figure 11B:
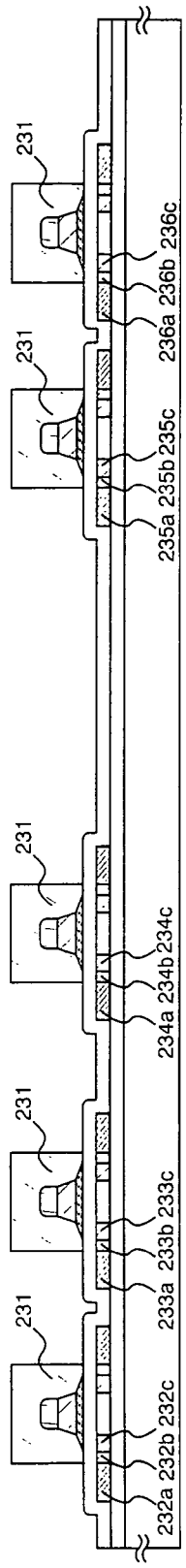

Then a resist mask 231 is formed to conduct a second doping treatment for doping the semiconductor layers with an impurity element imparting the n-type conductivity (FIG. 11B). In this doping treatment, ion doping or ion implanting is employed. Conditions for ion doping include setting the dose to $1\times10^{13}$ to $5\times10^{15}$ atoms/cm$^2$ and setting the acceleration voltage to 60 to 100 keV. In this embodiment, the dose is set to $1.5\times10^{15}$ atoms/cm$^2$ and the acceleration voltage is set to 80 keV. The impurity element imparting n-type conductivity is an element belonging to Group 15 in the periodic table, typically, phosphorus (P) or arsenic (As). Phosphorus (P) is used here. In this case, the conductive layers 218 to 222 serve as masks against the impurity element imparting the n-type conductivity as high concentration impurity regions 232a to 236a, low concentration impurity regions 232b to 236b, which do not overlap the first conductive layers, and low concentration impurity regions 232c to 236c, which overlap the first conductive layers, are formed in a self-aligning manner. The high concentration impurity regions 232a to 236a are doped with the impurity element imparting the n-type conductivity in a concentration of $1\times10^{20}$ to $1\times10^{21}$ atoms/cm$^3$.

The semiconductor films for forming the p-channel TFT do not need to be doped with the impurity element imparting the n-type conductivity through the second doping treatment shown in FIG. 11B. Therefore the mask 231 is formed so as to cover the semiconductor layers 204 and 206 completely, thereby preventing the layers from being doped with the n-type impurity element. The mask 231 may not be provided on the semiconductor layers 204 and 206. In this case, the polarity of these semiconductor layers is changed to p-type in a third doping treatment.

Figure 11C:
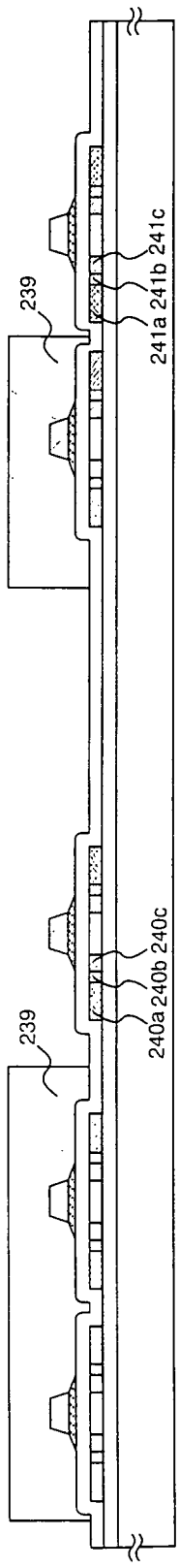

After removing the resist mask 231, a resist mask 239 is newly formed for the third doping treatment. Formed through the third doping treatment in the semiconductor layer that is to serve as an active layer of the p-channel TFT are impurity regions 240a to 240c and 241a to 241c doped with an impurity element imparting the conductivity type (p-type) opposite to the conductivity type (n-type) in the second doping treatment (FIG. 11C). The first conductive layers 220b and 222b are used as masks against the impurity element, and doping of the impurity element imparting the p-type conductivity is carried out to form the impurity regions in a self-aligning manner. In this embodiment, the impurity regions 240a to 240c and 241a to 241c are formed by ion doping using diborane ($B_2H_6$). The semiconductor layers for forming the n-channel TFTs are covered with the resist mask 239 during the third doping treatment. The impurity regions 240a to 240c have been doped with phosphorus in different concentrations through the first doping treatment and the second doping treatment. However, in the third doping treatment, the impurity regions 240a to 240c are both doped with the impurity element for imparting the p-type conductivity in a concentration of $2\times10^{20}$ to $2\times10^{21}$ atoms/cm$^3$. Therefore the impurity regions 240a to 240c have no problem in functioning as a source region or a drain region of the p-channel TFT.

The next step is to activate the impurity elements used to dope the respective semiconductor layers. This activation step employs thermal annealing using an annealing furnace. The thermal annealing is conducted in nitrogen atmosphere with the oxygen concentration being 1 ppm or less, preferably 0.1 ppm or less, at a temperature of 400 to 700° C., typically, 500 to 550° C. In this embodiment, the activation is made by heat treatment at 550° C. for four hours. Other usable methods than thermal annealing include laser annealing and rapid thermal annealing (RTA).

The activation may be carried out before the first interlayer insulating film is formed. However, if the material used for the wiring is weak against heat, it is preferred to conduct activation after the interlayer insulating film (an insulating film containing silicon as main ingredient, e.g., a silicon nitride film) as in this embodiment in order to protect the wiring and others as well.

Another heat treatment is conducted in atmosphere containing 3 to 100% hydrogen at 300 to 550° C. for one to twelve hours to hydrogenate the semiconductor layers. In this embodiment, heat treatment is carried out in nitrogen atmosphere containing about 3% of hydrogen at 410° C. for an hour. This step is to terminate dangling bonds in the semiconductor layers by hydrogen contained in the interlayer insulating film. Other hydrogenation measures include plasma hydrogenation (that utilizes hydrogen excited by plasma).

Further, the hydrogenation process may also be performed after forming a passivation film.

Impurity regions are formed in the respective semiconductor layers by the above steps.

Next, the mask 239 made from resist is removed, and a third etching process is performed. The conductive layers 218 to 222 are used as masks in Embodiment 5, and the gate insulating film is etched.

Gate insulating films 243c to 247c are formed below the second conductive layers 243b to 247b by the third etching process (See FIG. 12A). First conductive layers 243a to 247a and the second conductive layers 243b to 247b constitute gate electrodes 243 to 247.

A passivation film 291 is formed next so as to cover the substrate 200. (See FIG. 12B.) A silicon oxide film, a silicon nitride film, or a silicon oxynitride film can be used as the passivation film 291. For example, a silicon oxynitride film formed from SiH$_4$, NH$_3$, and N$_2$O with a thickness of 250 to 800 nm (preferably 300 to 500 nm) by plasma CVD, and a hydrogenated silicon oxynitride film formed similarly from SiH$_4$ and N$_2$O with a thickness of 250 to 800 nm (preferably 300 to 500 nm) may be formed in a lamination layer. The passivation film 291 is formed from a single layer structure of nitric oxide with a thickness of 0.5 to 1.5 μm in Embodiment 5.

A first interlayer insulating film 249 is formed next. An insulating film containing silicon is formed having a thickness of 100 to 200 nm by plasma CVD or sputtering. A silicon oxynitride film having a film thickness of 150 nm is formed by plasma CVD in Embodiment 5. The first interlayer insulating film 249 is of course not limited to a silicon oxynitride film, and other insulating films containing silicon may also be used in a single layer or a lamination structure. Patterning is performed next in order to form contact holes reaching the respective impurity regions 232a, 233a, 235a, 240a, and 241a.

Source wirings 251 to 255 and drain wirings 257 to 261 are formed next. (See FIG. 12C.) Note that it is preferable to use a material having excellent reflective properties such as a film having Al or Ag as its main constituent, or a lamination film of these films, as the wiring material in Embodiment 5.

Figure 13A:
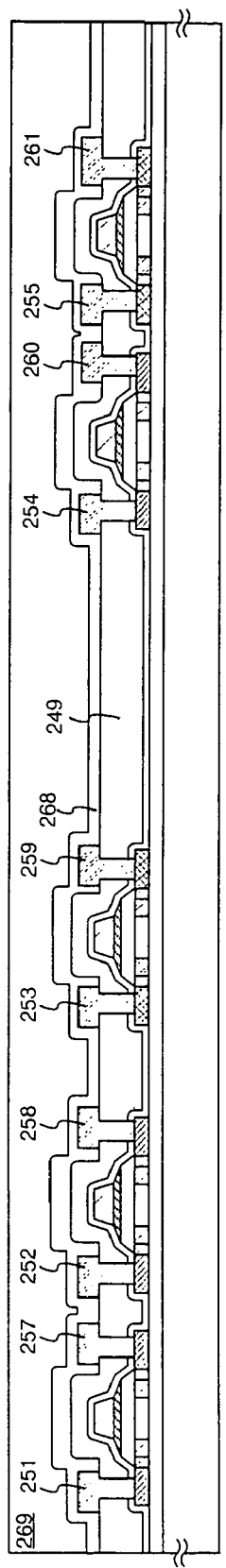
FIGS. 13A to 13B are diagrams showing the method of manufacturing an information device of the present invention.
Figure 13B:
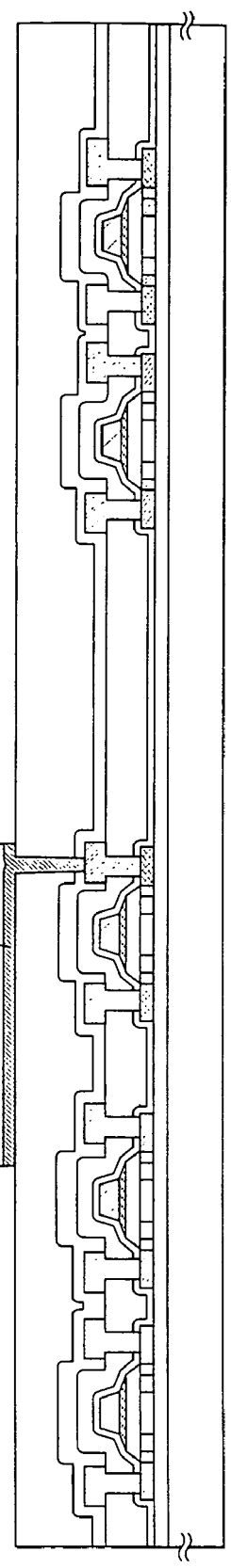

A second passivation film 268 is formed next having a thickness of 50 to 500 nm (typically from 200 to 300 nm) as shown in FIG. 13A. A 300 nm thick silicon oxynitride film is used as the second passivation film 268 in Embodiment 5. A silicon nitride film may also be substituted. Note that it is effective to perform plasma processing using a gas containing hydrogen, such as $H_2$ or $NH_3$, in advance of the formation of the silicon oxynitride film.

A second interlayer insulating film 269 made from an organic resin is formed next. A material such as polyimide, polyamide, acrylic, or BCB (benzocyclobutene) can be used as the organic resin. In particular, it is preferable to use acrylic having superior levelness, because the second interlayer insulating film 269 has a strong implication as a leveling film. In Embodiment 5, an acrylic film is formed having a film thickness capable of sufficiently leveling the steps formed by the TFTs. It is preferable that the film thickness be 1 to 5 μm (more preferably between 2 and 4 μm).

A contact hole for reaching the drain wiring 259 is then formed in the second interlayer insulating film 269 and in the second passivation film 268, and a cathode electrode 270 of the photodiode is formed so as to contact the drain wiring 259. An aluminum film formed by sputtering is used as the cathode electrode 270 in Embodiment 5, but other metals, for example, titanium, tantalum, tungsten, and copper can also be used. Furthermore, a lamination film of titanium, aluminum, and titanium may also be used.

Patterning is performed after forming an amorphous silicon film containing hydrogen on the entire surface of the substrate, forming a photoelectric conversion layer 271. A transparent conductive film is then formed on the entire surface of the substrate. A 200 nm thick ITO film is formed as the transparent conductive film by sputtering in Embodiment 5. The transparent conductive film is then patterned, forming an anode electrode 272. (See FIG. 13B.)

Figure 14A:
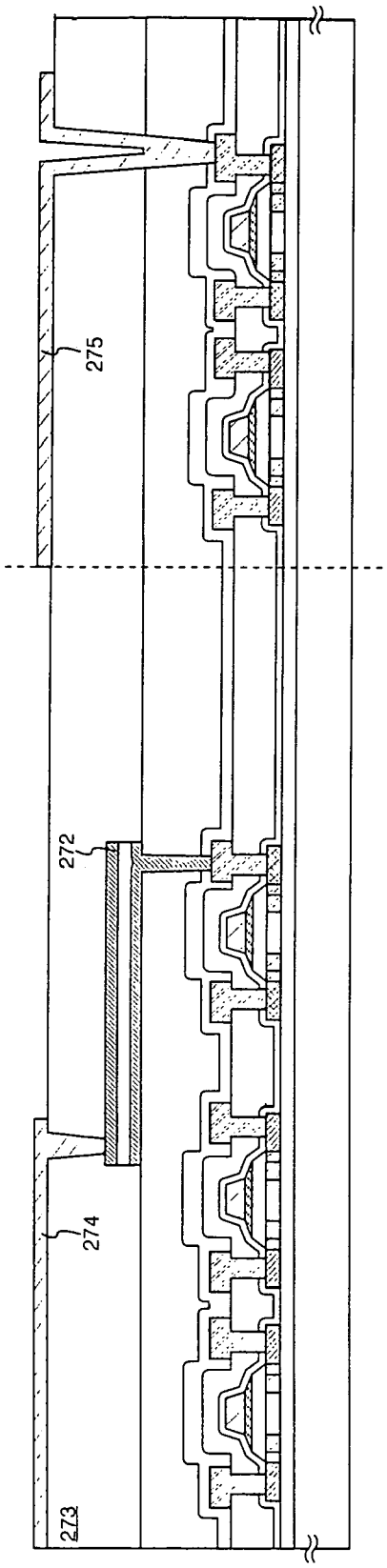
FIGS. 14A to 14B are diagrams showing the method of manufacturing an information device of the present invention.

A third interlayer insulating film 273 is formed next as shown in FIG. 14A. A level surface can be obtained by using a resin such as polyimide, polyamide, polyimide amide, or acrylic as the third interlayer insulating film 273. A polyimide film having a thickness of 0.7 μm is formed over the entire substrate surface as the third interlayer insulating film 273 in Embodiment 5.

Next, a contact hole for reaching the drain wiring 261 is formed in the third interlayer insulating film 273, in the second interlayer insulating film 269, and in the second passivation film 268, and a pixel electrode 275 is formed. Further, a contact hole for reaching the anode electrode 272 is formed in the third interlayer insulating film 273, and a sensor wiring 274 is formed. An aluminum alloy film (an aluminum film containing 1 wt % of titanium) is formed with a thickness of 300 nm in Embodiment 5. Patterning is then performed, forming the sensor wiring 274 and the pixel electrode 275 at the same time.

Figure 14B:
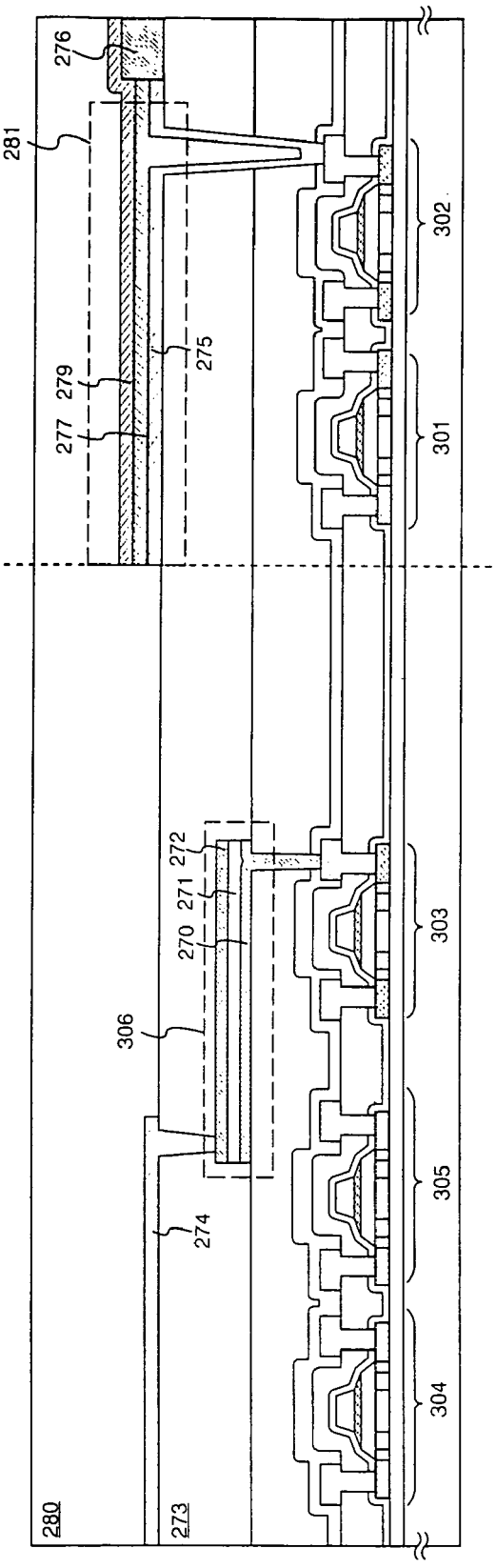

Next, as shown in FIG. 14B, a bank 276 made from a resin material is formed. The bank 276 may be formed by patterning an acrylic film or a polyimide film having a thickness of 1 to 2 μm. The bank 276 may be formed along and on the source wiring 254, and it may also be formed along and on a gate wiring (not shown in the figures). Note that the bank 276 may also be used as a shielding film by mixing a material such as a pigment into the resin material forming the bank 276.

A light emitting layer 277 is formed next. Specifically, an organic EL material which becomes the light emitting layer 277 is dissolved in a solvent such as chloroform, dichloromethane, xylene, toluene, or tetrahydrofuran and then applied. The solvent is then driven off by performing heat treatment. A film (light emitting layer) is thus formed from the organic EL material.

Note that although only one pixel is shown in the figures in Embodiment 5, a light emitting layer that emits red color light, a light emitting layer that emits green color light, and a light emitting layer that emits blue color light are all formed at the same time at this point in the case where an information device which performs color display is manufactured, cyanopolyphenylene-vinylene is used for the light emitting layer that emits red color light, polyphenylene-vinylene is used for the light emitting layer that emits green color light, and polyalkyl-phenylene is used for the light emitting layer that emits blue color light in Embodiment 5. The respective layers are formed with a thickness of 50 nm. Further, 1,2-dichloromethane is used as the solvent, and heat treatment is performed for 1 to 5 minutes at a temperature of 80 to 150° C. using a hot plate, thereby volatilizing the solvent.

A one layer structure comprised of a light emitting layer is taken for the EL layer in Embodiment 5, but other layers such as a hole injecting layer, a hole transporting layer, an electron injecting layer, and an electron transporting layer may also be formed. Many examples of combination have already been reported, and any of the structures may be used.

An anode 279 made from a transparent conductive film is formed with a thickness of 120 nm as an opposing electrode after forming the light emitting layer 277. The transparent conductive film in which 10 to 20 wt % of zinc oxide is added to indium oxide is used in Embodiment 5. It is preferable to form the anode 279 using evaporation at room temperature as the film formation method so as not to damage the light emitting layer 277.

A fourth interlayer insulating film 280 is then formed as shown in FIG. 14B after forming the anode 279. A level surface can be obtained by using a resin such as polyimide, polyamide, polyimide amide, or acrylic as the fourth interlayer insulating film 280. A 0.7 μm thick polyimide film is formed over the entire substrate surface as the fourth interlayer insulating film 280 in Embodiment 5.

A substrate having a structure like that shown in FIG. 14B (hereafter referred to as a TFT substrate) is thus completed. Note that it is effective to perform processing in succession up to the formation of the fourth interlayer insulating film 280, without exposure to the atmosphere, by using a multi-chamber method (or an in-line method) thin film formation apparatus after forming the bank 276.

The buffer TFT 304, the selection TFT 305, the reset TFT 303, the photodiode 306, the switching TFT 301, the EL driver TFT 302, and the EL element 281 can thus be formed on the same substrate.

Note that the TFTs structuring respective driver circuits (an EL display source signal line driver circuit, an EL display gate signal line driver circuit, a sensor source signal line driver circuit, and a sensor gate signal line driver circuit) can also be manufactured similarly in accordance with the above manufacturing process. The driver circuits can thus be formed on the same substrate as the combination display portion and input portion.

Note that it is possible to implement the present embodiment by freely being combined with any of Embodiments 1 to 4.

Embodiment 6

In this embodiment, an example of manufacturing the information device using the present invention is described with reference to FIGS. 6A to 6C.

Figure 6A:
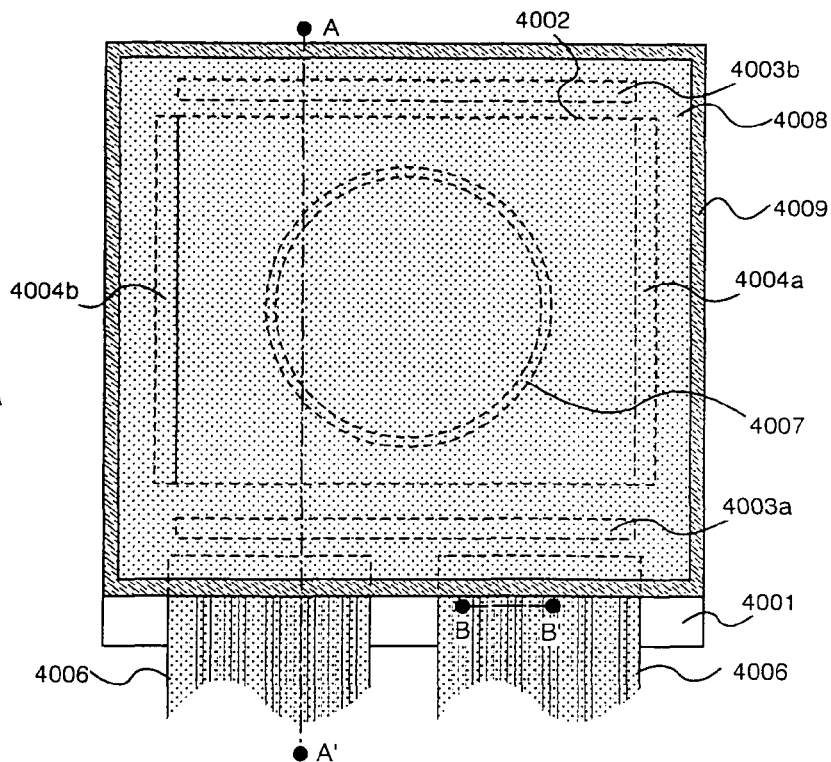
FIGS. 6A to 6C are upper surface diagrams and cross sectional diagrams of an information device of the present invention.
Figure 6B:
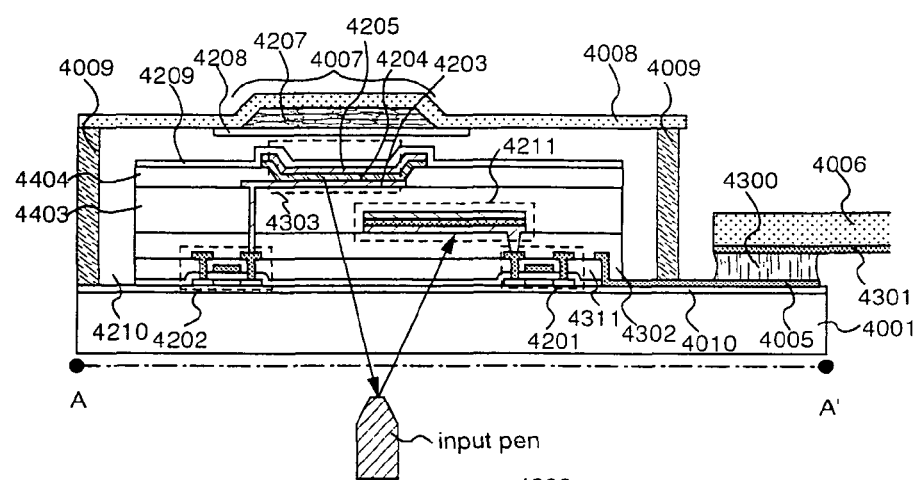
Figure 6C:
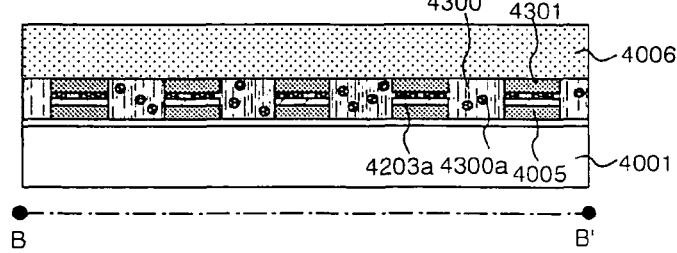
Figure 7:
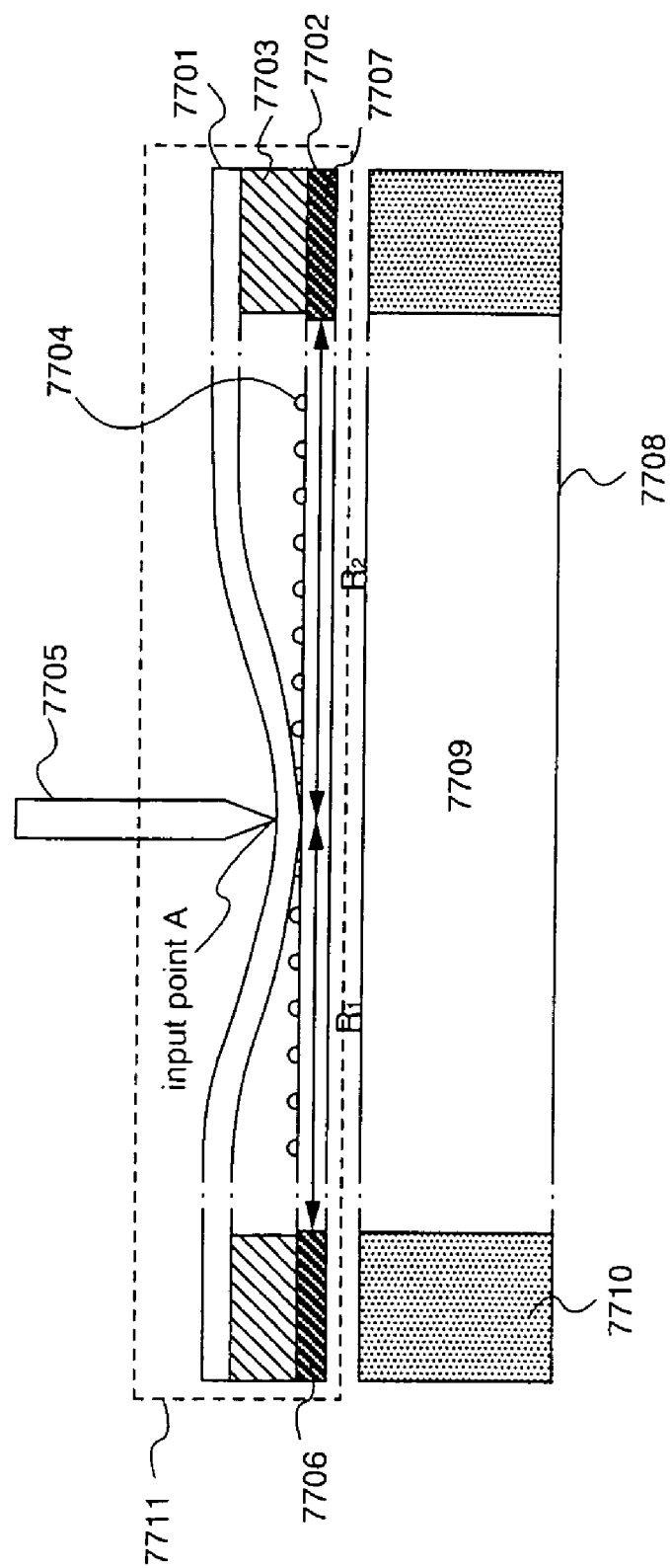
FIG. 7 is a diagram showing the structure of a conventional resistive film pen input device.
Figure 8:
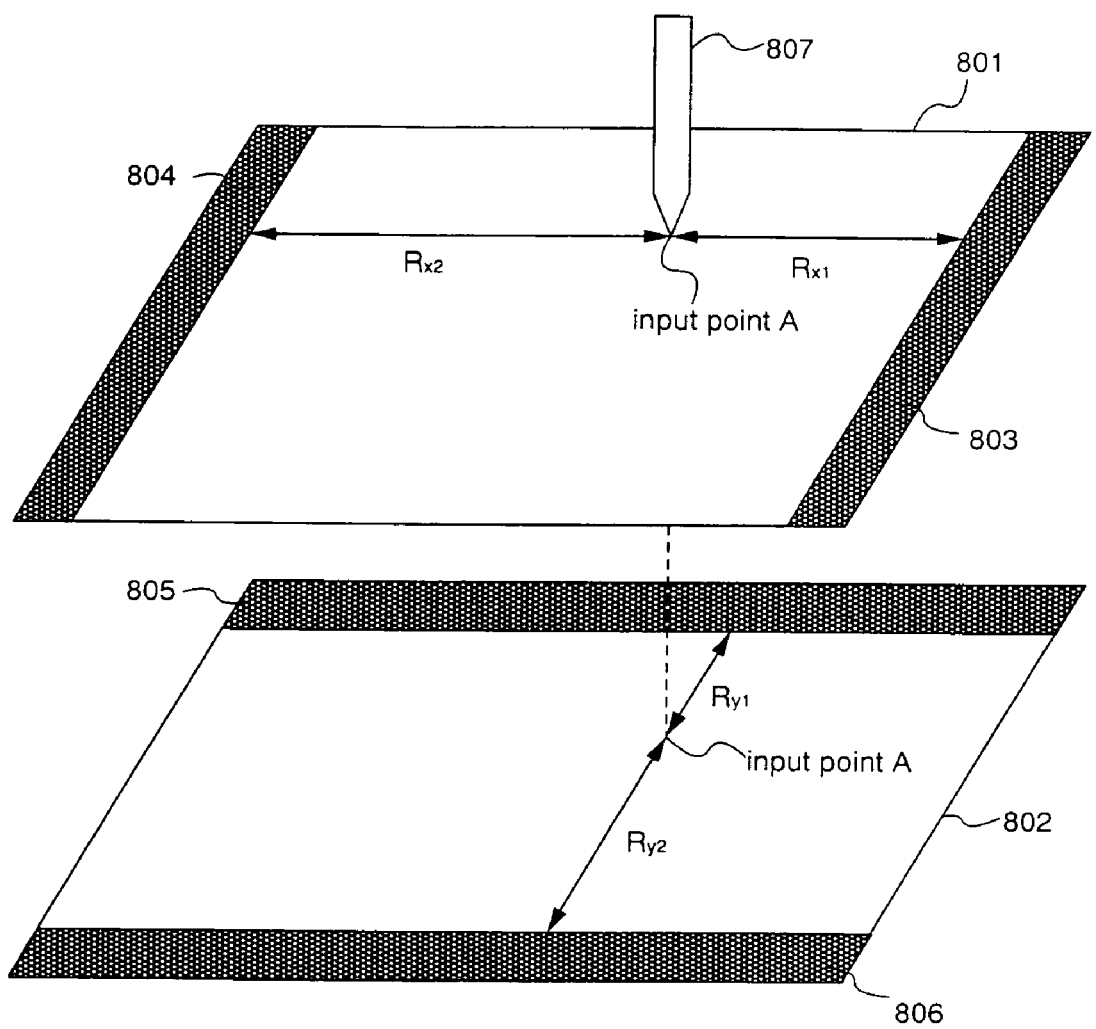
FIG. 8 is a diagram showing the structure of a conventional resistive film pen input device.
Figure 9B:
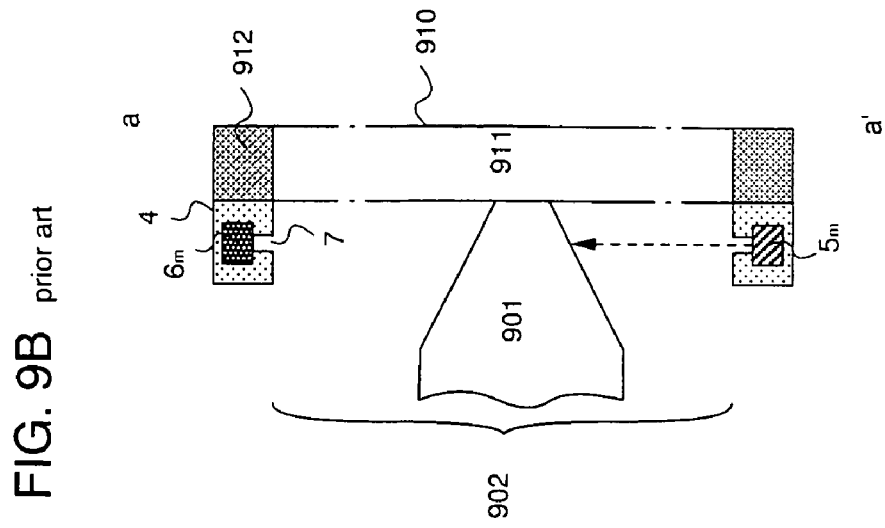
FIGS. 9A and 9B are diagrams showing structures of a conventional optical pen input device.
Figure 9A:
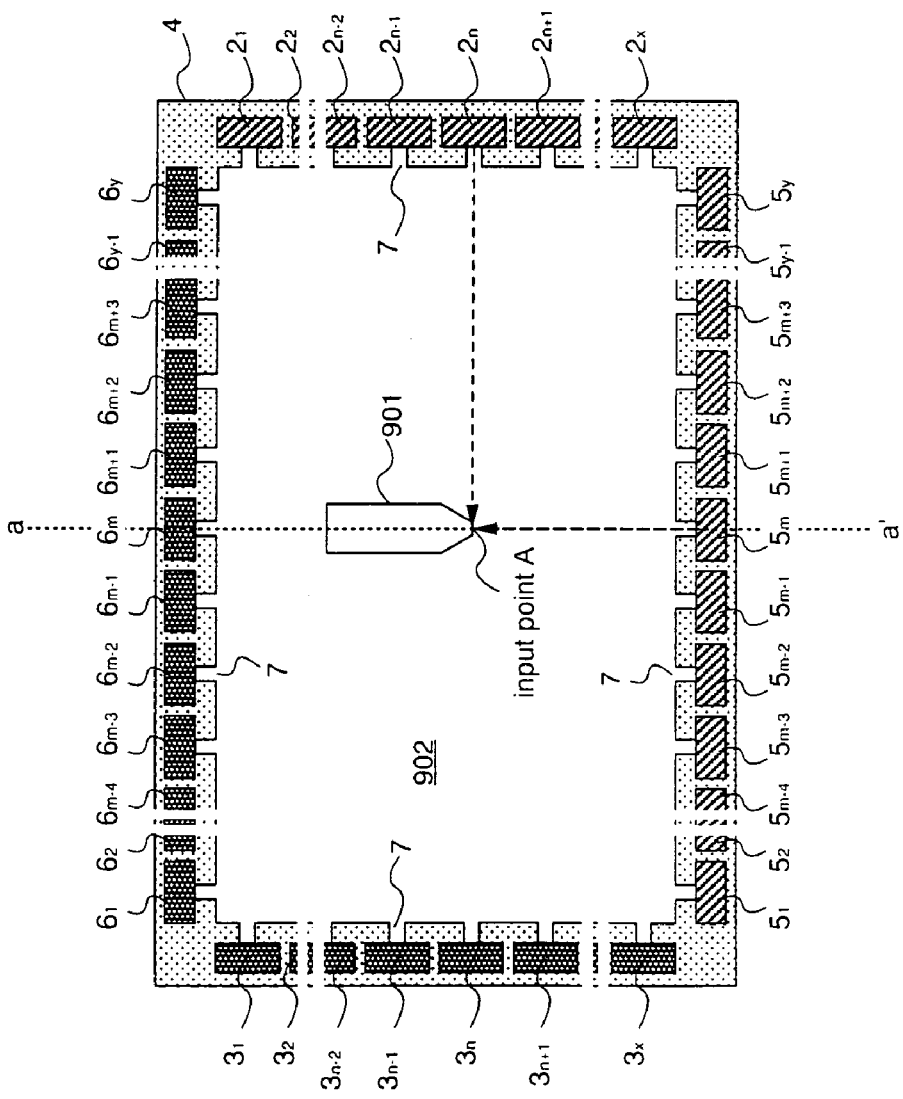

FIG. 6A is a top view of an EL display device, FIG. 6B is a sectional view taken along a line A-A' of FIG. 6A, and FIG. 6C is a sectional view taken along a line B-B' of FIG. 6A.

A seal member 4009 is provided so as to surround a combination of display portion and input portion 4002, a source signal line driver circuit 4003a and 4003b for a sensor and an EL element, and the gate signal line driver circuits 4004a and 4004b for a sensor and an EL element, which are provided on a substrate 4001. Further, a sealing member 4008 is provided over the combination of display portion and input portion 4002, the source signal line driver circuit 4003a and 4003b for a sensor and an EL element, and the gate signal line driver circuits 4004a and 4004b for a sensor and an EL element. Thus, the combination of display portion and input portion 4002, the source signal line driver circuit 4003a and 4003b for a sensor and an EL element, and the first and the second gate signal line driver circuits 4004a and 4004b for a sensor and an EL element are sealed with a filler 4210 and by the substrate 4001, the seal member 4009, and the sealing member 4008.

Further, the combination of display portion and input portion 4002, the source signal line driver circuit 4003a and 4003b for a sensor and an EL element, and the gate signal line driver circuits 4004a and 4004b for a sensor and an EL element provided on the substrate 4001 include a plurality of TFTs. FIG. 6B typically shows a reset TFTs (TFTs for applying a reverse bias heating to a photodiode) 4201 included in the combination of display portion and input portion 4002, an EL driver TFT (a TFT for controlling current to an EL element) 4202 and the photodiode 4211, which are formed on a base film 4010.

In this embodiment, the n-channel TFT fabricated by a well-known method are used as the reset TFTs 4201, and a p-channel TFT fabricated by a well-known method is used as the EL driver TFT 4202. Further, the storage capacitor (not shown in the figure) connected to the gate of the EL driver TFT 4202 is provided at the combination of display portion and input portion 4002.

A first interlayer insulating film (flattening film) 4311 is formed on the reset TFTs 4201 and the EL driver TFT 4202. Next, the second interlayer insulating film (flattening film) 4302, and a photodiode 4211 is formed on thereon. Then, the third interlayer insulating film 4403 is formed, and a pixel electrode (anode) 4203 electrically connected to a drain of the EL driver TFT 4202 is formed thereon. A transparent conductive film having a high work function is used as the pixel electrode 4203. A compound of indium oxide and tin oxide, a compound of indium oxide and zinc oxide, zinc oxide, tin oxide, or indium oxide can be used for the transparent conductive film. Further, the transparent conductive film added with gallium may be used.

An insulating film 4404 is formed on the pixel electrode 4203, and an opening portion is formed in the insulating film 4404 over the pixel electrode 4203. In this opening portion, an EL (electro-luminescence) layer 4204 is formed on the pixel electrode 4203. A well-known organic EL material or inorganic EL material can be used for the EL layer 4204. Although the organic EL material includes a low molecular system (monomer system) and a high molecular system (polymer system), either may be used.

As a formation method of the EL layer 4204, a well-known evaporation technique or coating technique may be used. The structure of the EL layer may be a laminate structure obtained by freely combining a hole injection layer, a hole transporting layer, a light emitting layer, an electron transporting layer, or an electron injection layer, or a single layer structure.

A cathode 4205 made of a conductive film (typically a conductive film containing aluminum, copper or silver as its main ingredient, or a laminate film of those and another conductive films) having a light shielding property is formed on the EL layer 4204. It is desirable that moisture and oxygen existing on the interface between the cathode 4205 and the EL layer 4204 are removed to the utmost. Accordingly, it is necessary to make such contrivance that the EL layer 4204 is formed in a nitrogen or rare gas atmosphere, and the cathode 4205 is formed while the EL layer is not exposed to oxygen or moisture. In this embodiment, a multi-chamber system (cluster tool system) film forming apparatus is used, so that the film formation as described above is enabled. A predetermined voltage is applied to the cathode 4205.

In the manner as described above, an EL element 4303 constituted by the pixel electrode (anode) 4203, the EL layer 4204, and the cathode 4205 are formed. Then, a protection film 4209 is formed on the insulating film 4404 so as to cover the EL element 4303. The protection film 4209 is effective to prevent oxygen, moisture and the like from penetrating into the EL element 4303.

Reference numeral 4005 designates a drawing wiring line connected to a power supply line and is electrically connected to a source region of the EL driver TFT 4202. The drawing wiring line 4005 passes between the seal member 4009 and the substrate 4001, and is electrically connected to an FPC wiring line 4301 included in an FPC 4006 through an anisotropic conductive film 4300.

As the sealing member 4008, a glass member, a metal member (typically, a stainless member), a ceramic member, or a plastic member (including a plastic film) can be used. As the plastic member, all FRP (Fiberglass-Reinforced Plastics) plate, a PVF (polyvinyl fluoride) film, a Mylar film, a polyester film or an acryl resin film can be used. Further, a sheet having such a structure that an aluminum foil is interposed between PVF films or Mylar films can also be used.

However, in the case when the radiation direction of light from the EL element is directed toward the side of a cover member, the cover member must be transparent. In this case, a transparent material such as a glass plate, a plastic plate, a polyester film, or an acryl film is used.

As the filler 4210, in addition to an inert gas such as nitrogen or argon, ultraviolet ray curing resin or thermosetting resin can be used, and PVC (polyvinyl chloride), acryl, polyimide, epoxy resin, silicone resin, PVB (polyvinyl butyral), or EVA (ethylene-vinyl acetate) can be used. In this embodiment, nitrogen was used as the filler.

Further, in order to expose the filler 4210 to a hygroscopic material (preferably, barium oxide) or a material capable of adsorbing oxygen, a recess portion 4007 is provided on the surface of the sealing member 4008 on the side of the substrate 4001 and the hygroscopic material or the material 4207 capable of adsorbing oxygen is disposed. Then, in order to prevent the hygroscopic material or the material 4207 capable of adsorbing oxygen from scattering, the hygroscopic material or the material capable of adsorbing oxygen are held in the recess portion 4007 by a recess cover member 4208. Note that, the recess cover member 4208 is formed into a fine mesh, and has such a structure that air or moisture is permeated and the hygroscopic material or the material 4207 capable of adsorbing oxygen is not permeated. The deterioration of the EL element 4303 can be suppressed by providing therewith the hygroscopic material or the material 4207 capable of adsorbing oxygen.

As shown in FIG. 6C, at the same time as the formation of the pixel electrode 4203, a conductive film 4203a is formed to be in contact with the drawing wiring line 4005.

The anisotropic conductive film 4300 includes a conductive filler 4300a. The substrate 4001 and the FPC 4006 are thermally compressed, so that the conductive film 4203a on the substrate 4001 and the FPC wiring line 4301 on the FPC 4006 are electrically connected through the conductive filler 4300a.

Further, this embodiment can be implemented by freely combined with Embodiments 1 to 5.

Embodiment 7

An example of manufacturing a photoelectric conversion element of an information device of the present invention using an organic compound is explained in Embodiment 7.

An example of using a photodiode as the photoelectric conversion element is explained.

An organic compound is used as the photoelectric conversion layer consisting of the photodiode. Specifically, compounds such as an azo dye, a polycyclic compound such as perillen, a phthalocyanine pigment, and an ionic pigment can be used. Note that the photoelectric conversion layer is referred to as an electric charge generating layer here.

Further, layers such as an electric charge injection barrier layer and an electric charge transporting layer may also be formed in addition to the electric charge generating layer.

Low molecular weight materials such as a hydrazone derivative, a stilbenzene derivative, and a triphenylamine derivative, and high molecular weight materials such as a polysilane derivative can be utilized for the electric charge transporting layer.

The responsiveness to light of the photodiode can be improved by forming this type of electric charge transporting layer.

Further, a material such as a copolymer nylon can be used as the electric charge injection barrier layer.

Figure 19:
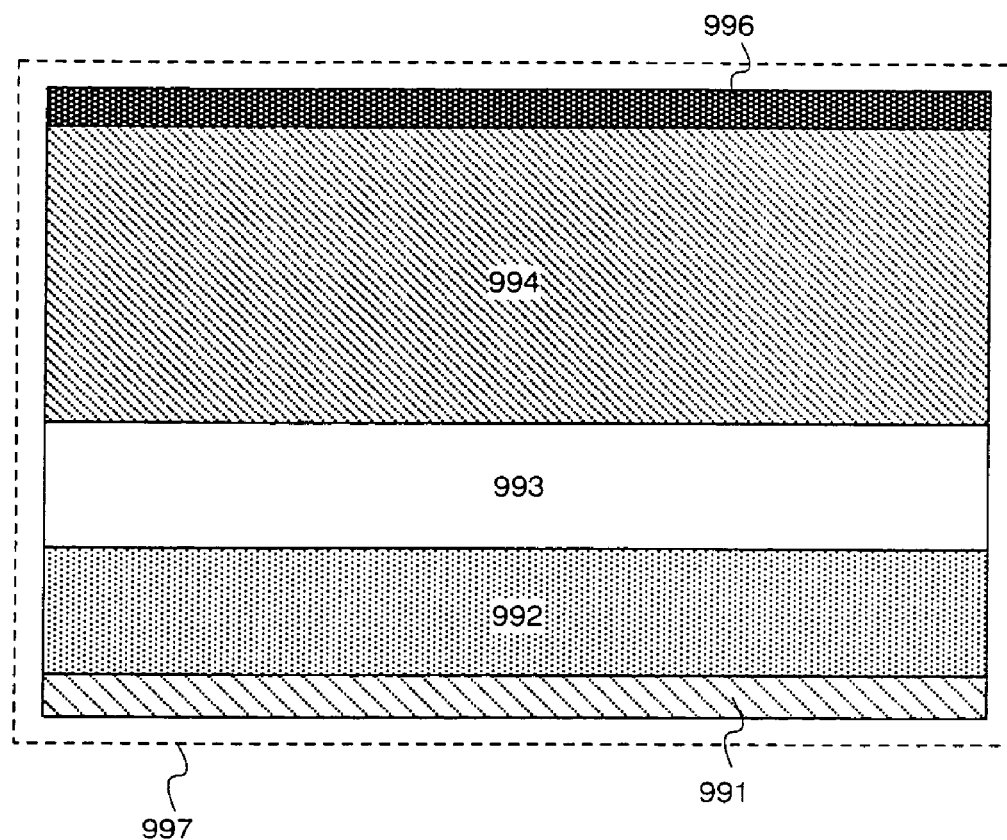
FIG. 19 is a diagram showing the structure of a photoelectric conversion element of an information device of the present invention.

A method of manufacturing this type of photodiode having a lamination structure of an electric charge injection barrier layer, an electric charge generating layer, and an electric charge transporting layer is explained using FIG. 19.

An anode electrode 991 is formed from an ITO film, and an electric charge injection barrier layer 992, an electric charge generating layer 993, an electric charge transporting layer 994, and a cathode electrode 996 are formed in order on the anode electrode 991.

A copolymer nylon layer is applied as the electric charge injection barrier layer 992 here.

The electric charge generating layer 993 is then formed by applying a material in which an azo dye is distributed in a binder resin.

The electric charge transporting layer 994 is formed next by applying a material in which a hydrazone derivative is distributed in a binder resin.

Lastly, the cathode electrode 996 is formed by aluminum, and the photodiode 997 is completed.

Note that the photodiode structure is not limited to this structure. It is not always necessary to form the electric charge injection barrier layer or the electric charge transporting layer.

Further, the anode electrode, the cathode electrode, the electric charge injection barrier layer, the electric charge generating layer, and the electric charge transporting layer are not limited to the above stated materials, and known materials can be freely used.

Compared to photodiodes using inorganic compounds such as semiconductors, those using organic compounds have the following advantages: it is possible to manufacture large surface area photodiodes; organic compound photodiodes have abundant elasticity; and organic compound photodiodes have superior processing properties.

Note that it is possible to implement the present embodiment by freely combining it with any of Embodiments 1 to 6.

Embodiment 8

Electronic devices applying an information device of the present invention are explained in Embodiment 8. Devices such as portable information terminals (PDAs, portable telephones, electronic books, and the like) can be given as examples of applying an information device of the present invention.

Figure 15A:
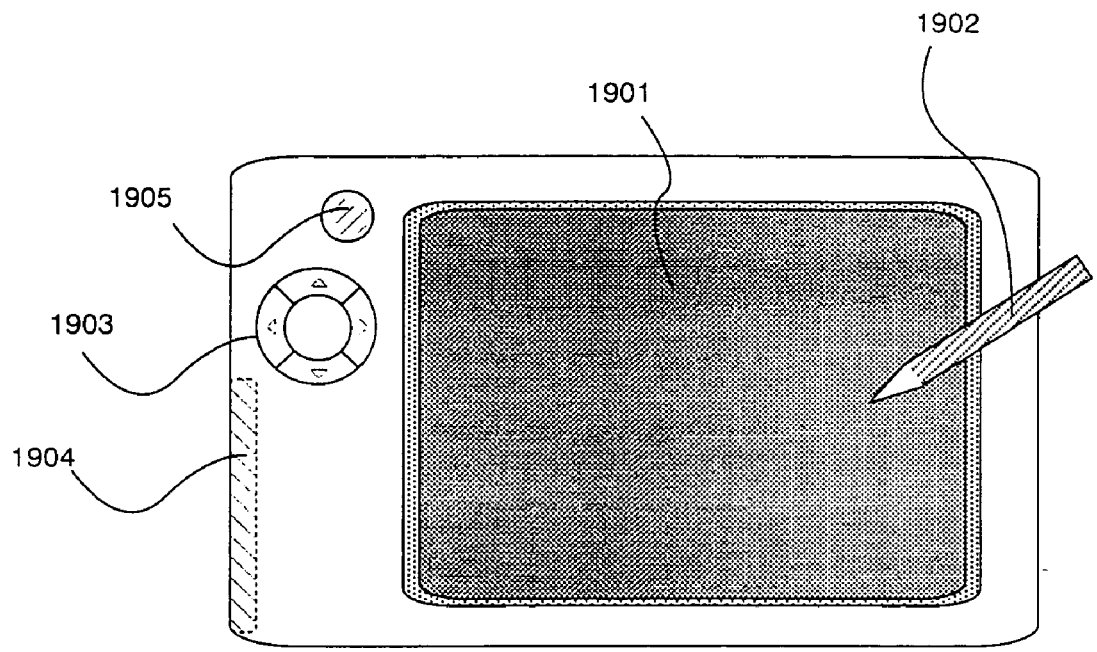
FIGS. 15A to 15B are diagrams of electronic devices applying an information device of the present invention.

FIG. 15A is a schematic diagram of a PDA. The PDA has a combination display portion and input portion 1901, an input pen 1902, an operation key 1903, an external connection port 1904, and an electric power source switch 1905. An information device of the present invention can be used in the combination display portion and input portion 1902 of the PDA.

Figure 15B:
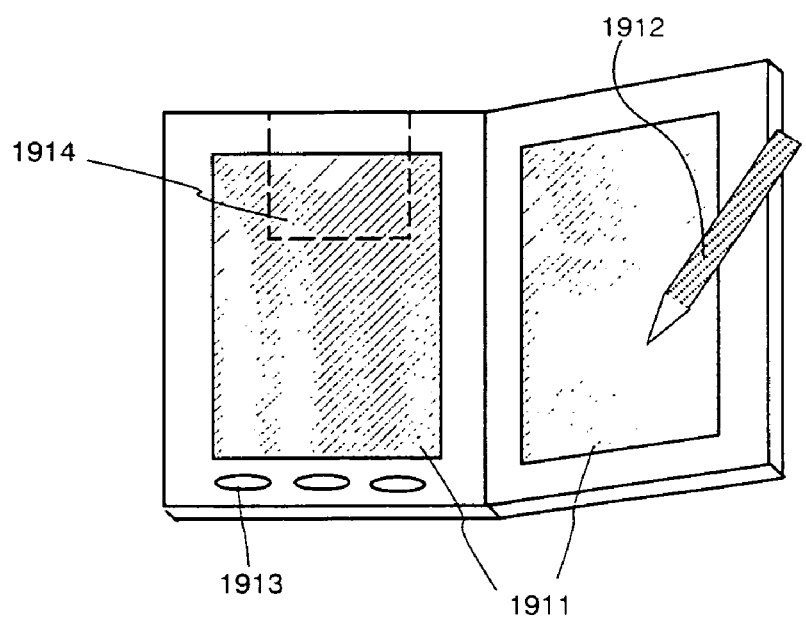

FIG. 15B is a schematic diagram of an electronic book. The electronic book has a combination display portion and input portion 1911, an input pen 1912, operation keys 1913, and a recording medium 1914. An information device of the present invention can be used in the combination display portion and input portion 1911.

Figure 21A:
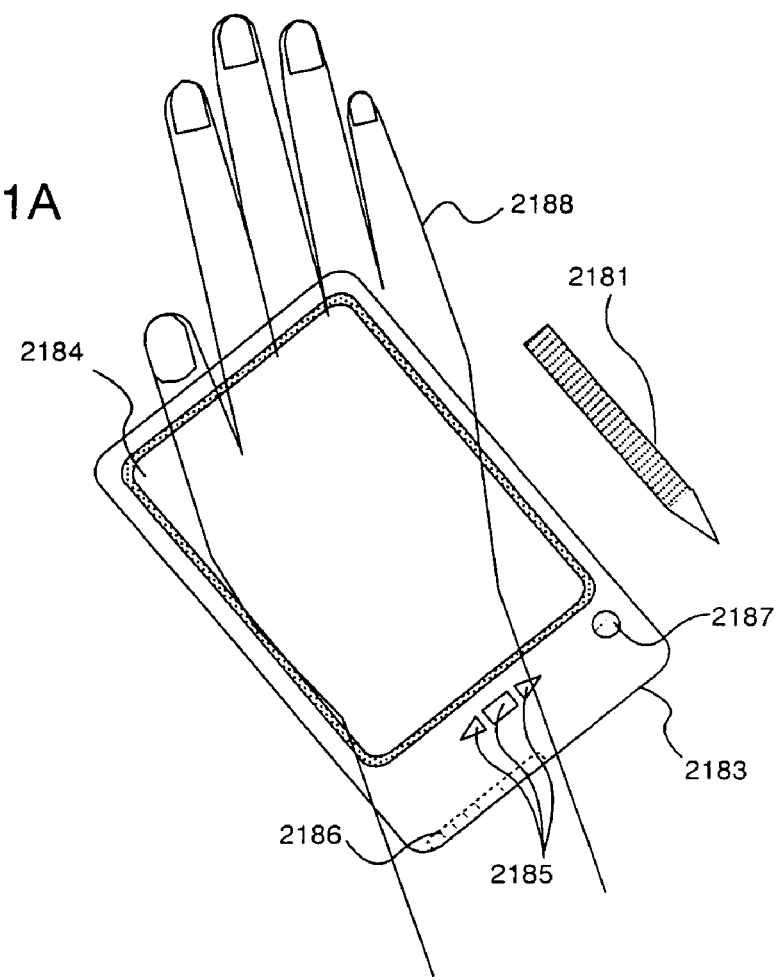
FIGS. 21A and 21B are diagrams of electronic equipment applying all information device of the present invention.
Figure 21B:
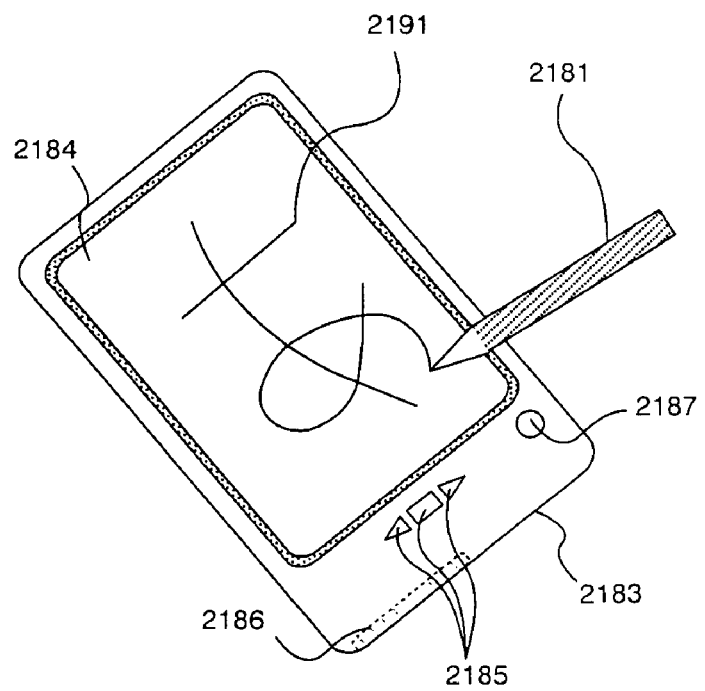

FIG. 21A and FIG. 21B are examples of applying an information device of the present invention to a portable information terminal having a function of personal recognition.

The term personal recognition refers here to a function of comparing information recorded in advance with information input later, and then using the two sets of information to judge whether or not the same person is indicated.

FIG. 21A shows a portable information terminal 2183. The portable information terminal 2183 has components such as an input pen 2181, a combination display portion and input portion 2184, operation keys 2185, an external connection port 2186, and an electric power source switch 2187.

A palm print can be read in by placing a hand 2188 on the combination display portion and input portion 2184 in accordance with a method of using the combination display portion and input portion 2184 as an image sensor, like the method shown in Embodiment 4.

The palm print read in can be used as information for identifying individual person (individual information), and recognition processing can be performed.

Note that the individual information used in the recognition process is not limited to only palm prints. Other biological information such as finger prints can also be freely used.

Further, these types of individual information for performing recognition can be freely combined and then used.

FIG. 21B is a portable information device having the same structure as that shown by FIG. 21A, and a case of performing recognition processing by a different method is explained.

Handwriting 2191 information input to the combination display portion and input portion 2184 by the input pen 2181 is used here for recognition processing.

Note that individual information such as handwriting input by the input pen, and individual information such as palm prints and fingerprints input by using the image sensor can be freely combined and applied to a portable information terminal that performs recognition of its owner.

The applicable range of the present invention is extremely wide, and it is possible to apply the present invention to electronic devices of all fields. Further, the electronic devices of Embodiment 8 can be realized using structure in which Embodiments 1 to 7 are freely combined.

There are problems in areas such as image visibility, endurance of the device, precision, miniaturization, and electric power consumption in an information device having a conventional resistive film method or optical method pen input function.

Both EL elements and photoelectric conversion elements are arranged in each pixel of a display device in an information device of the present invention having a pen input function. Information input is performed by the input of light to the photoelectric conversion elements in accordance with a pen that reflects light by a pen tip. An information device with a pen input function, capable of displaying a clear image without loss of brightness in the displayed image, having superior endurance, capable of being miniaturized, and having good precision call thus be obtained.

What is claimed is:

1. A portable electronic book comprising:
   a plurality of pixels arranged in a matrix shape, each of the plurality of pixels comprising an EL element and a photoelectric conversion element over a same substrate, wherein the EL element is located above the photoelectric conversion element with an interlayer insulating film interposed therebetween;
   a means for making the EL element emit light;
   an input pen for reflecting a light emitted by the EL element and for inputting the light to the photoelectric conversion element of a portion of pixels among the plurality of pixels; and
   a means for detecting coordinates of the portion of the pixels.

2. A portable electronic book according to claim 1, wherein each of the plurality of pixels comprises a selection TFT, a buffer TFT, and a reset TFT;
   the means of detecting the intensity of light emitted to the photoelectric conversion elements comprising:
      a plurality of sensor output wirings;
      a plurality of sensor gate signal lines;
      a plurality of reset gate signal lines;
      a plurality of sensor electric power source lines;
      a sensor source signal line driver circuit into which signals from the plurality of sensor output wirings are input; and
      a sensor gate signal line driver circuit from which signals are output to the plurality of sensor gate signal lines and the plurality of reset gate signal lines,
   wherein:
      a gate electrode of the selection TFT is connected to one of the plurality of sensor gate signal lines;
      one of a source region and a drain region of the selection TFT is connected to one of the plurality of sensor output wirings, and the remaining one of the source region and the drain region of the selection TFT is connected to a source region of the buffer TFT;
      a drain region of the buffer TFT is connected to one of the plurality of sensor electric power source lines;
      a gate electrode of the buffer TFT is connected to a photodiode and a source region or a drain region of the reset TFT;
      one of the source region and the drain region of the reset TFT, which is not connected to the buffer TFT, is connected to one of the plurality of sensor electric power source lines; and
      a gate electrode of the reset TFT is connected to one of the plurality of reset gate signal lines.

3. A portable electronic book according to claim 2, wherein the sensor source signal line driver circuit and the sensor gate signal line driver circuit are formed over the same substrate as the EL element and the photoelectric conversion element.

4. A portable electronic book according to claim 1, wherein each of the plurality of pixels comprises a switching TFT and an EL driver TFT;
   the means of making the EL elements emit light comprising:
      a plurality of EL display source signal lines;
      a plurality of EL display gate signal lines;
      a plurality of electric power source supply lines;
      an EL display source signal line driver circuit for outputting signals to the plurality of EL display source signal lines; and
      an EL display gate signal line driver circuit for outputting signals to the plurality of EL display gate signal lines,
   wherein:
      a gate electrode of the switching TFT is connected to one of the plurality of EL display gate signal lines;
      one of a source region and a drain region of the switching TFT is connected to one of the plurality of EL display source signal lines, and the other of the source region and the drain region of the switching TFT is connected to a gate electrode of the EL driver TFT; and
      one of a source region and a drain region of the EL driver TFT is connected to one of the plurality of electric power source supply lines, and the other of the source region and the drain region of the EL driver TFT is connected to the EL element.

5. A portable electronic book according to claim 4, wherein the EL display source signal line driver circuit and the EL display gate signal line driver circuit are formed over the same substrate as the EL element and the photoelectric conversion element.

6. A portable electronic book according to claim 1, wherein the photoelectric conversion element comprises a photodiode.

7. A portable electronic book according to claim 6, wherein the photodiode comprises an anode electrode, a cathode electrode, and a photoelectric conversion layer comprising an organic material sandwiched between the anode electrode and the cathode electrode.

8. A portable electronic book according to claim 6, wherein the photodiode comprises a p-type semiconductor layer, an n-type semiconductor layer, and a photoelectric conversion layer comprising an amorphous semiconductor sandwiched between the p-type semiconductor layer and the n-type semiconductor layer.

9. A portable electronic book according to claim 1, wherein the information device has a means for irradiating a light emitted from the EL element to a surface of an object, and inputting the light reflected by the surface of the object to the photoelectric conversion element.

10. A portable electronic book according to claim 9, wherein an information of the surface of the object is biological information comprising at least one selected from the group consisting of a palm print and a finger print.

11. A portable electronic book comprising:
a plurality of pixels arranged in a matrix shape, each of the plurality of pixels comprising an EL element and a photoelectric conversion element over a same substrate, wherein the EL element is located above the photoelectric conversion element with an interlayer insulating film interposed therebetween;
a means for making the EL element emit light;
an input pen for reflecting a light emitted by the EL element and for inputting the light to the photoelectric conversion element of a portion of pixels among the plurality of pixels; and
a means for detecting an intensity of the light irradiated to the photoelectric conversion element.

12. A portable electronic book according to claim 11, wherein each of the plurality of pixels comprises a selection TFT, a buffer TFT, and a reset TFT;
the means of detecting the intensity of light emitted to the photoelectric conversion elements comprising:
a plurality of sensor output wirings;
a plurality of sensor gate signal lines;
a plurality of reset gate signal lines;
a plurality of sensor electric power source lines;
a sensor source signal line driver circuit into which signals from the plurality of sensor output wirings are input; and
a sensor gate signal line driver circuit from which signals are output to the plurality of sensor gate signal lines and the plurality of reset gate signal lines,
wherein:
a gate electrode of the selection TFT is connected to one of the plurality of sensor gate signal lines;
one of a source region and a drain region of the selection TFT is connected to one of the plurality of sensor output wirings, and the remaining one of the source region and the drain region of the selection TFT is connected to a source region of the buffer TFT;
a drain region of the buffer TFT is connected to one of the plurality of sensor electric power source lines;
a gate electrode of the buffer TFT is connected to a photodiode and a source region or a drain region of the reset TFT;
one of the source region and the drain region of the reset TFT, which is not connected to the buffer TFT, is connected to one of the plurality of sensor electric power source lines; and
a gate electrode of the reset TFT is connected to one of the plurality of reset gate signal lines.

13. A portable electronic book according to claim 12, wherein the sensor source signal line driver circuit and the sensor gate signal line driver circuit are formed over the same substrate as the EL element and the photoelectric conversion element.

14. A portable electronic book according to claim 11, wherein each of the plurality of pixels comprises a switching TFT and an EL driver TFT;
the means of making the EL elements emit light comprising:
a plurality of EL display source signal lines;
a plurality of EL display gate signal lines;
a plurality of electric power source supply lines;
an EL display source signal line driver circuit for outputting signals to the plurality of EL display source signal lines; and
an EL display gate signal line driver circuit for outputting signals to the plurality of EL display gate signal lines,
wherein:
a gate electrode of the switching TFT is connected to one of the plurality of EL display gate signal lines;
one of a source region and a drain region of the switching TFT is connected to one of the plurality of EL display source signal lines, and the other of the source region and the drain region of the switching TFT is connected to a gate electrode of the EL driver TFT; and
one of a source region and a drain region of the EL driver TFT is connected to one of the plurality of electric power source supply lines, and the other of the source region and the drain region of the EL driver TFT is connected to the EL element.

15. A portable electronic book according to claim 14, wherein the EL display source signal line driver circuit and the EL display gate signal line driver circuit are formed over the same substrate as the EL element and the photoelectric conversion element.

16. A portable electronic book according to claim 11, wherein the photoelectric conversion element comprises a photodiode.

17. A portable electronic book according to claim 16, wherein the photodiode comprises an anode electrode, a cathode electrode, and a photoelectric conversion layer comprising an organic material sandwiched between the anode electrode and the cathode electrode.

18. A portable electronic book according to claim 16, wherein the photodiode comprises a p-type semiconductor layer, an n-type semiconductor layer, and a photoelectric conversion layer comprising an amorphous semiconductor sandwiched between the p-type semiconductor layer and the n-type semiconductor layer.

19. A portable electronic book according to claim 11, wherein the information device has a means for irradiating a light emitted from the EL element to a surface of an object, and inputting the light reflected by the surface of the object to the photoelectric conversion element.

20. A portable electronic book according to claim 19, wherein an information of the surface of the object is biological information comprising at least one selected from the group consisting of a palm print and a finger print.

21. A portable electronic book comprising:
a plurality of pixels arranged in a matrix shape, each of the plurality of pixels comprising an EL element and a photoelectric conversion element over a same substrate, wherein the EL element is located above the photoelectric conversion element with an interlayer insulating film interposed therebetween;
a means for making the EL element emit light; and
a means for detecting coordinates of the portion of the pixels.

22. A portable electronic book according to claim 21, wherein each of the plurality of pixels comprises a selection TFT, a buffer TFT, and a reset TFT;
the means of detecting the intensity of light emitted to the photoelectric conversion elements comprising:
a plurality of sensor output wirings;
a plurality of sensor gate signal lines;
a plurality of reset gate signal lines;
a plurality of sensor electric power source lines;
a sensor source signal line driver circuit into which signals from the plurality of sensor output wirings are input; and a sensor gate signal line driver circuit from which signals are output to the plurality of sensor gate signal lines and the plurality of reset gate signal lines, wherein:
a gate electrode of the selection TFT is connected to one of the plurality of sensor gate signal lines;
one of a source region and a drain region of the selection TFT is connected to one of the plurality of sensor output wirings, and the remaining one of the source region and the drain region of the selection TFT is connected to a source region of the buffer TFT;
a drain region of the buffer TFT is connected to one of the plurality of sensor electric power source lines;
a gate electrode of the buffer TFT is connected to a photodiode and a source region or a drain region of the reset TFT;
one of the source region and the drain region of the reset TFT, which is not connected to the buffer TFT, is connected to one of the plurality of sensor electric power source lines; and
a gate electrode of the reset TFT is connected to one of the plurality of reset gate signal lines.

23. A portable electronic book according to claim 22, wherein the sensor source signal line driver circuit and the sensor gate signal line driver circuit are formed over the same substrate as the EL element and the photoelectric conversion element.

24. A portable electronic book according to claim 21, wherein each of the plurality of pixels comprises a switching TFT and an EL driver TFT;

the means of making the EL elements emit light comprising:
a plurality of EL display source signal lines;
a plurality of EL display gate signal lines;
a plurality of electric power source supply lines;
an EL display source signal line driver circuit for outputting signals to the plurality of EL display source signal lines; and
an EL display gate signal line driver circuit for outputting signals to the plurality of EL display gate signal lines,
wherein:
a gate electrode of the switching TFT is connected to one of the plurality of EL display gate signal lines;
one of a source region and a drain region of the switching TFT is connected to one of the plurality of EL display source signal lines, and the other of the source region and the drain region of the switching TFT is connected to a gate electrode of the EL driver TFT; and
one of a source region and a drain region of the EL driver TFT is connected to one of the plurality of electric power source supply lines, and the other of the source region and the drain region of the EL driver TFT is connected to the EL element.

25. A portable electronic book according to claim 24, wherein the EL display source signal line driver circuit and the EL display gate signal line driver circuit are formed over the same substrate as the EL element and the photoelectric conversion element.

26. A portable electronic book according to claim 21, wherein the photoelectric conversion element comprises a photodiode.

27. A portable electronic book according to claim 26, wherein the photodiode comprises an anode electrode, a cathode electrode, and a photoelectric conversion layer comprising an organic material sandwiched between the anode electrode and the cathode electrode.

28. A portable electronic book according to claim 26, wherein the photodiode comprises a p-type semiconductor layer, an n-type semiconductor layer, and a photoelectric conversion layer comprising an amorphous semiconductor sandwiched between the p-type semiconductor layer and the n-type semiconductor layer.

29. A portable electronic book according to claim 21, wherein the information device has a means for irradiating a light emitted from the EL element to a surface of an object, and inputting the light reflected by the surface of the object to the photoelectric conversion element.

30. A portable electronic book according to claim 29, wherein an information of the surface of the object is biological information comprising at least one selected from the group consisting of a palm print and a finger print.

31. A portable electronic book comprising:
a plurality of pixels arranged in a matrix shape, each of the plurality of pixels comprising an EL element and a photoelectric conversion element over a same substrate, wherein the EL element is located above the photoelectric conversion element with an interlayer insulating film interposed therebetween;
a means for making the EL element emit light; and
a means for detecting an intensity of the light irradiated to the photoelectric conversion element.

32. A portable electronic book according to claim 31, wherein each of the plurality of pixels comprises a selection TFT, a buffer TFT, and a reset TFT;

the means of detecting the intensity of light emitted to the photoelectric conversion elements comprising:
a plurality of sensor output wirings;
a plurality of sensor gate signal lines;
a plurality of reset gate signal lines;
a plurality of sensor electric power source lines;
a sensor source signal line driver circuit into which signals from the plurality of sensor output wirings are input; and
a sensor gate signal line driver circuit from which signals are output to the plurality of sensor gate signal lines and the plurality of reset gate signal lines,
wherein:
a gate electrode of the selection TFT is connected to one of the plurality of sensor gate signal lines;
one of a source region and a drain region of the selection TFT is connected to one of the plurality of sensor output wirings, and the remaining one of the source region and the drain region of the selection TFT is connected to a source region of the buffer TFT;
a drain region of the buffer TFT is connected to one of the plurality of sensor electric power source lines;
a gate electrode of the buffer TFT is connected to a photodiode and a source region or a drain region of the reset TFT;
one of the source region and the drain region of the reset TFT, which is not connected to the buffer TFT, is connected to one of the plurality of sensor electric power source lines; and
a gate electrode of the reset TFT is connected to one of the plurality of reset gate signal lines.

33. A portable electronic book according to claim 32, wherein the sensor source signal line driver circuit and the sensor gate signal line driver circuit are formed over the same substrate as the EL element and the photoelectric conversion element.

34. A portable electronic book according to claim 31, wherein each of the plurality of pixels comprises a switching TFT and an EL driver TFT;

the means of making the EL elements emit light comprising:
- a plurality of EL display source signal lines;
- a plurality of EL display gate signal lines;
- a plurality of electric power source supply lines;
- an EL display source signal line driver circuit for outputting signals to the plurality of EL display source signal lines; and
- an EL display gate signal line driver circuit for outputting signals to the plurality of EL display gate signal lines, wherein:
- a gate electrode of the switching TFT is connected to one of the plurality of EL display gate signal lines;
- one of a source region and a drain region of the switching TFT is connected to one of the plurality of EL display source signal lines, and the other of the source region and the drain region of the switching TFT is connected to a gate electrode of the EL driver TFT; and
- one of a source region and a drain region of the EL driver TFT is connected to one of the plurality of electric power source supply lines, and the other of the source region and the drain region of the EL driver TFT is connected to the EL element.

35. A portable electronic book according to claim 34, wherein the EL display source signal line driver circuit and the EL display gate signal line driver circuit are formed over the same substrate as the EL element and the photoelectric conversion element.

36. A portable electronic book according to claim 31, wherein the photoelectric conversion element comprises a photodiode.

37. A portable electronic book according to claim 36, wherein the photodiode comprises an anode electrode, a cathode electrode, and a photoelectric conversion layer comprising an organic material sandwiched between the anode electrode and the cathode electrode.

38. A portable electronic book according to claim 36, wherein the photodiode comprises a p-type semiconductor layer, an n-type semiconductor layer, and a photoelectric conversion layer comprising an amorphous semiconductor sandwiched between the p-type semiconductor layer and the n-type semiconductor layer.

39. A portable electronic book according to claim 31, wherein the information device has a means for irradiating a light emitted from the EL element to a surface of an object, and inputting the light reflected by the surface of the object to the photoelectric conversion element.

40. A portable electronic book according to claim 39, wherein an information of the surface of the object is biological information comprising at least one selected from the group consisting of a palm print and a finger print.

* * * * *

UNITED STATES PATENT AND TRADEMARK OFFICE
CERTIFICATE OF CORRECTION

PATENT NO.       : 7,768,007 B2
APPLICATION NO.  : 10/802787
DATED            : August 3, 2010
INVENTOR(S)      : Shunpei Yamazaki et al.

It is certified that error appears in the above-identified patent and that said Letters Patent is hereby corrected as shown below:

Column 9, line 5, replace "all" with --an--;

Column 9, line 31, replace "all" with --an--;

Column 15, line 8, replace "re ion" with --region--;

Column 16, line 20, replace "electric-ally" with --electrically--;

Column 19, line 36, replace "all" with --an--;

Column 20, line 48, replace "call" with --can--;

Column 23, line 38, replace "call" with --can--;

Column 23, line 38, replace "all" with --an--;

Column 24, line 41, replace "(sate" with --gate--;

Column 24, line 51, replace "Ian" with --an--;

Column 29, line 51, replace "421l" with --4211--;

Column 30, line 40, replace "all" with --an--;

Column 33, line 25, replace "call" with --can--.

Signed and Sealed this
Fifteenth Day of February, 2011

David J. Kappos
*Director of the United States Patent and Trademark Office*